United States Patent
Yamazaki

(10) Patent No.: US 7,187,425 B2
(45) Date of Patent: Mar. 6, 2007

(54) PIXEL STRUCTURE, ELECTRO-OPTICAL APPARATUS, AND ELECTRONIC INSTRUMENT

(75) Inventor: Yasushi Yamazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 196 days.

(21) Appl. No.: 10/898,199

(22) Filed: Jul. 26, 2004

(65) Prior Publication Data

US 2005/0041188 A1 Feb. 24, 2005

(30) Foreign Application Priority Data

Aug. 11, 2003 (JP) ............... 2003-291635

(51) Int. Cl.
*G02F 1/1343* (2006.01)
(52) U.S. Cl. .................. 349/146; 349/144; 349/145
(58) Field of Classification Search ......... 349/144–146
See application file for complete search history.

(56) References Cited

U.S. PATENT DOCUMENTS

| 5,815,605 | A | | 9/1998 | Koike |
| 6,172,729 | B1 | * | 1/2001 | Ikeda .................. 349/145 |
| 6,429,599 | B1 | * | 8/2002 | Yokoyama ............ 315/169.3 |
| 6,756,953 | B1 | | 6/2004 | Tokioka et al. |
| 6,768,482 | B2 | * | 7/2004 | Asano et al. .......... 345/90 |
| 2005/0270444 | A1 | * | 12/2005 | Miller et al. ........ 349/108 |

FOREIGN PATENT DOCUMENTS

| CN | 1315720 A | 10/2001 |
| EP | 0 347 187 A2 | 6/1989 |
| JP | A-02-055383 | 2/1990 |
| JP | A-02-110433 | 4/1990 |
| JP | A-9-233383 | 9/1997 |
| JP | A-2001-306023 | 11/2001 |
| JP | A-2001-337317 | 12/2001 |
| JP | A-2002-221917 | 8/2002 |
| KR | 2002-0040613 | 5/2002 |

* cited by examiner

Primary Examiner—Huyen Ngo
(74) Attorney, Agent, or Firm—Oliff & Berridge, PLC

(57) ABSTRACT

Exemplary embodiments of the present invention include a pixel structure, an electro-optical apparatus, and an electronic instrument, which are capable of clearly displaying both images, such as natural paintings, and line drawings, such as characters, with a very simple structure. A pixel structure according to exemplary embodiments of the invention include a plurality of pixels disposed in a delta arrangement, each of the plurality of pixels having four sub-pixels that are four divisions divided from the pixel, and divided sides of the sub-pixels are arranged in a vertical direction or in a horizontal direction. In the course of display using a plurality of the pixels aligned in a delta arrangement, images, such as natural paintings, can be clearly displayed. On the other hand, in the course of display using a plurality of the second pixels A aligned in a square arrangement, line drawings, such as characters and figures, can be clearly displayed. The sub-pixel may also be shaped by dividing the pixel into two divisions.

8 Claims, 18 Drawing Sheets

F I G. 1
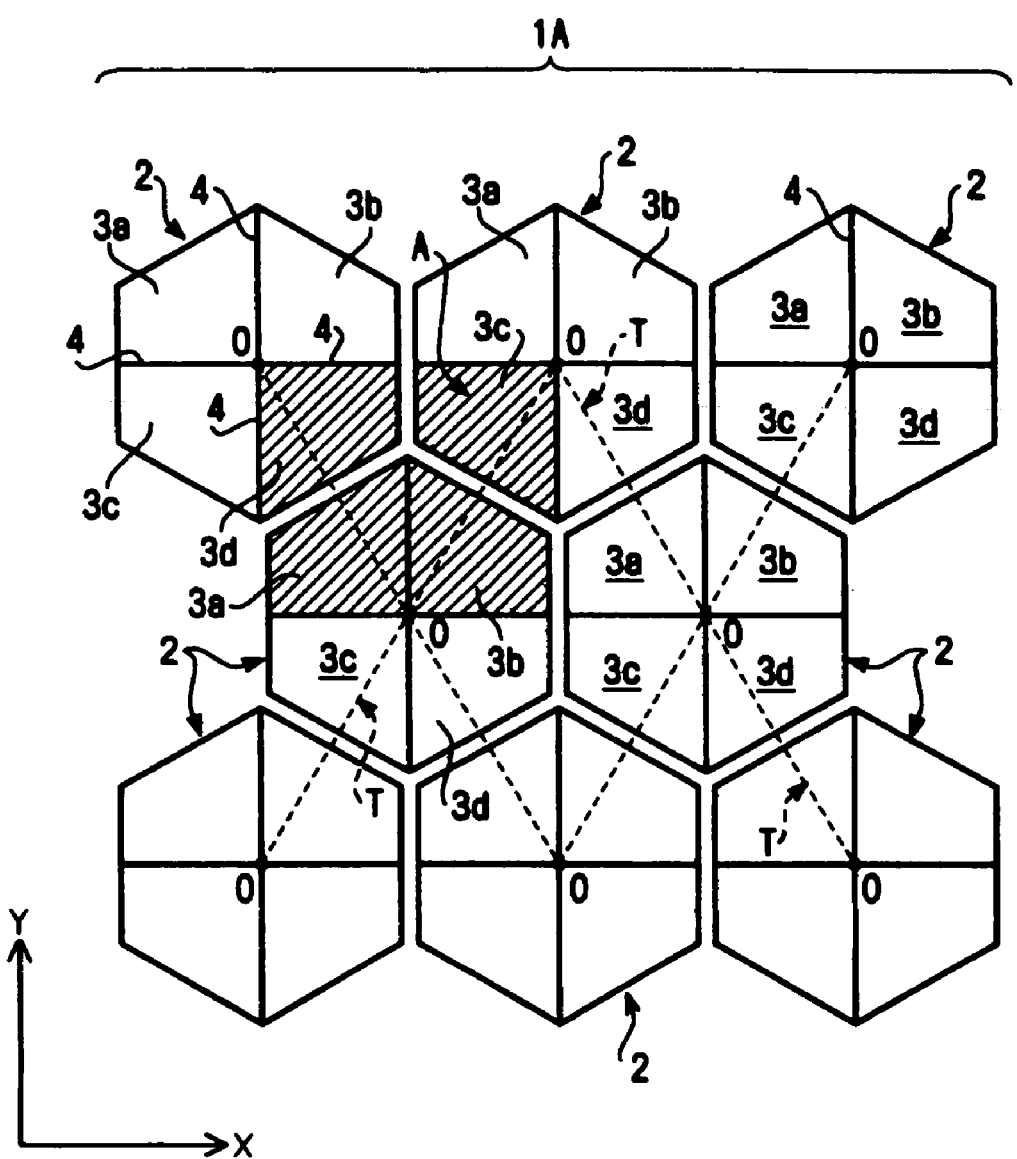

F I G. 1 4
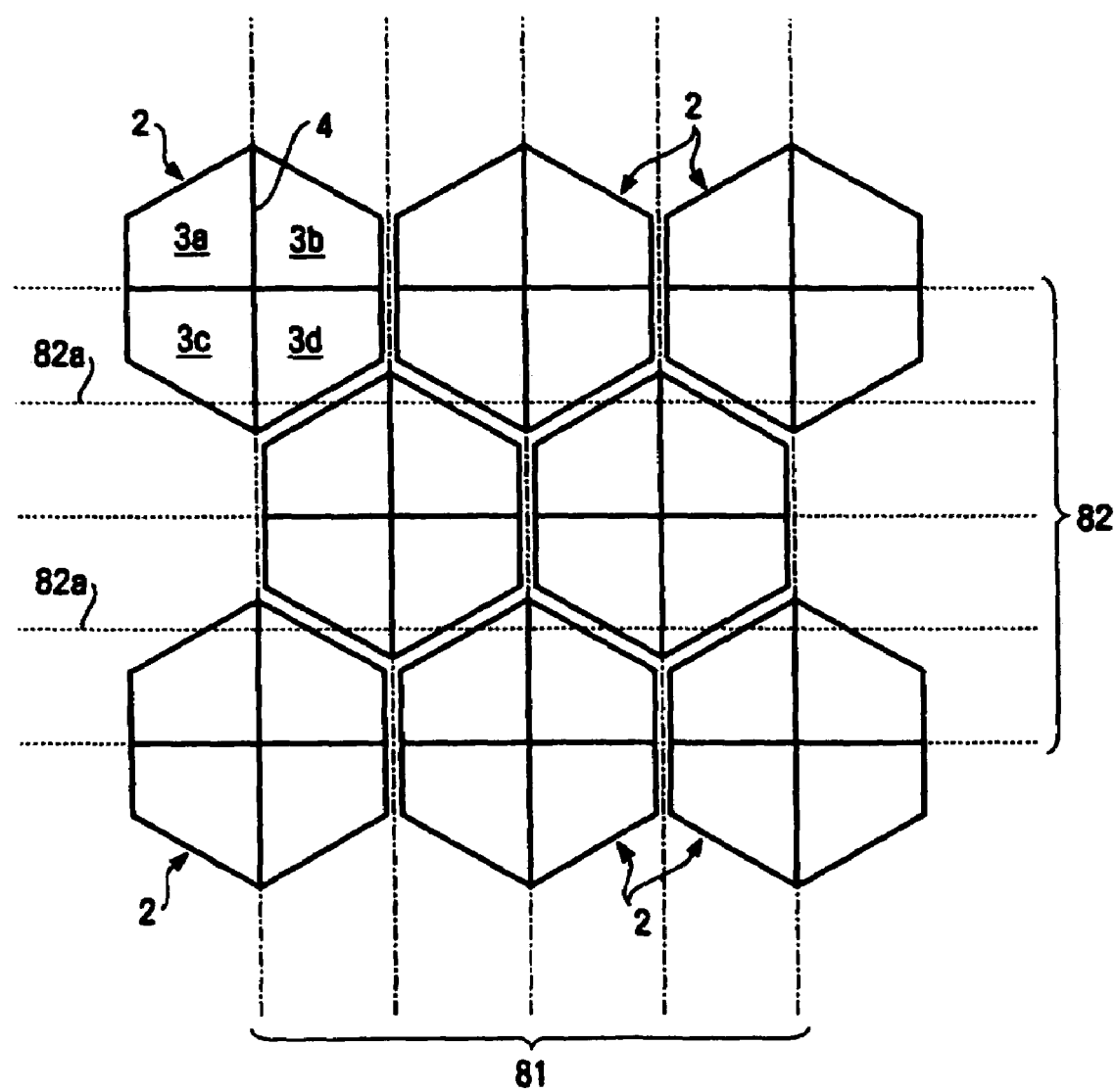

F I G. 1 7
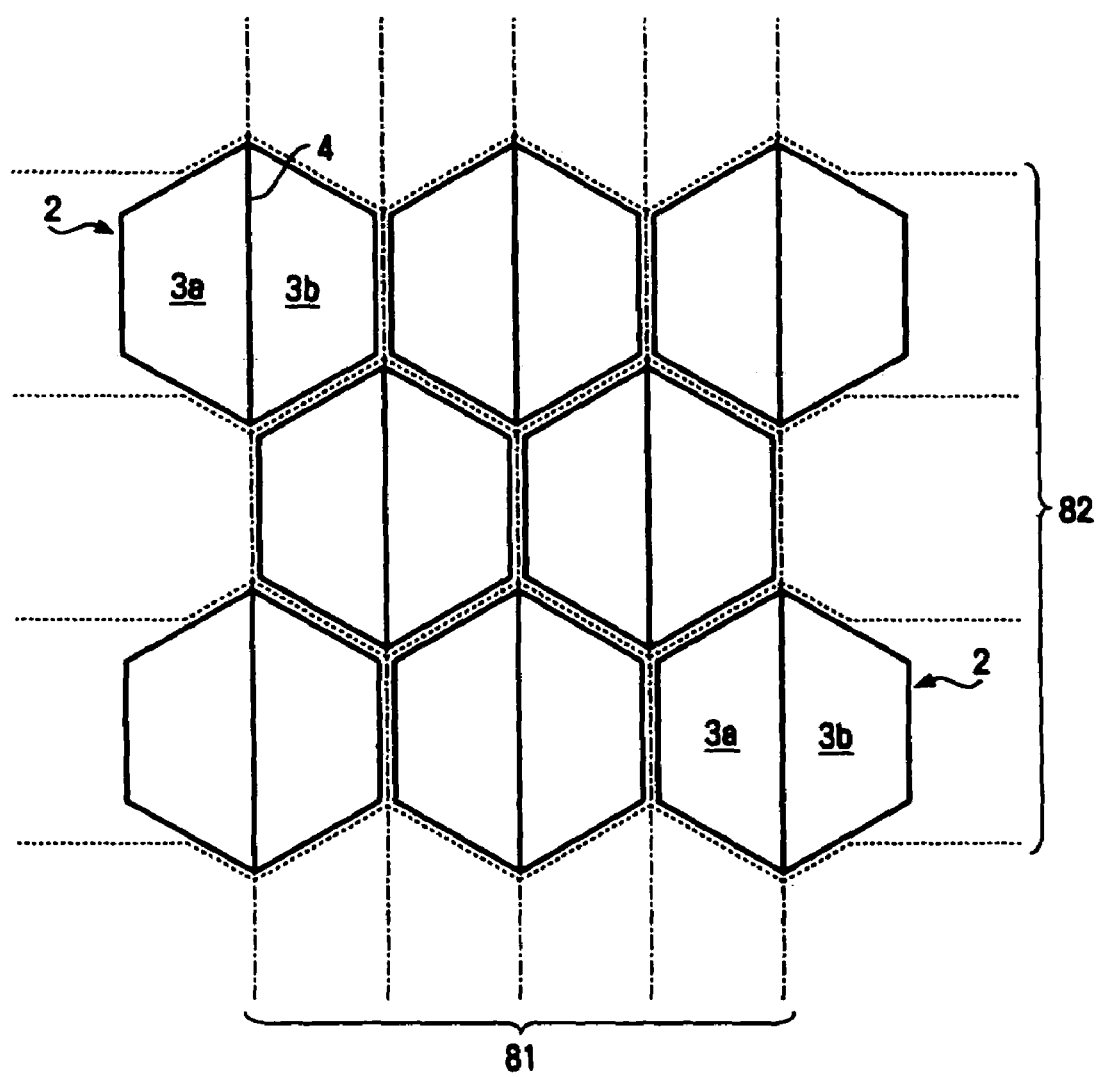

F I G. 1 8
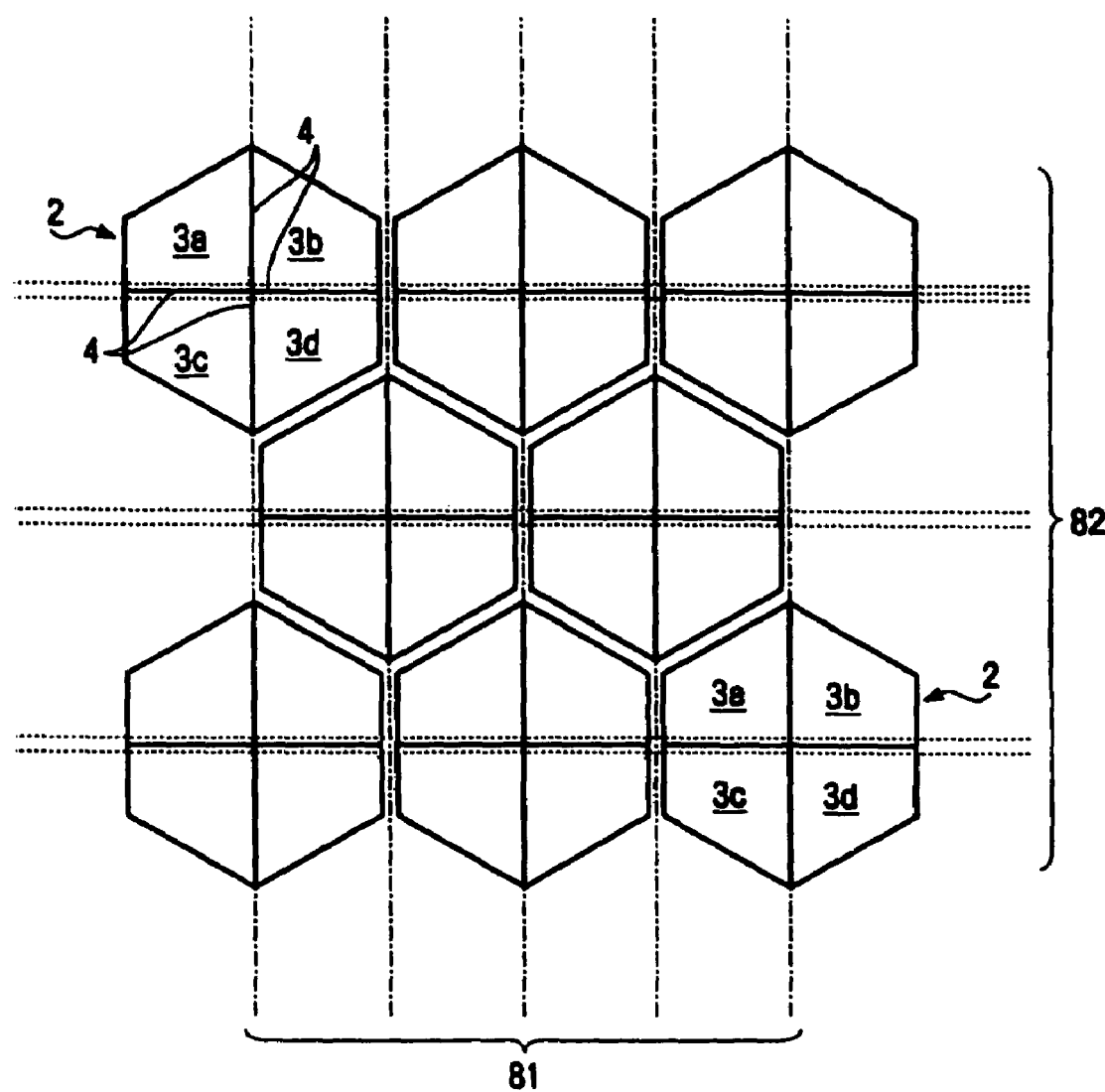

PIXEL STRUCTURE, ELECTRO-OPTICAL APPARATUS, AND ELECTRONIC INSTRUMENT

BACKGROUND OF THE INVENTION

1. Field of Invention

Exemplary embodiments of the present invention relate to a pixel structure for an electro-optical apparatus, such as a liquid crystal device and an organic EL (electro-luminescence) device. Exemplary embodiments include the electro-optical apparatus using the pixel structure and an electronic instrument, such as a liquid crystal projector, a mobile phone, and a hand-held information terminal.

2. Description of Related Art

A delta arrangement can display high-quality images with low-capacitance image data, and it is thereby suitable for displaying images, such as natural paintings. However, problems arise in that line drawings, such as characters and figures, become unclear. Thus, in an electro-optical apparatus mainly displaying character data, such as a computer monitor, an RGB stripe arrangement has been used in accordance with the related art. However, the stripe arrangement requires high-capacitance image data more than in the delta arrangement. That is, when data are transmitted with a limited band, a load is applied thereto so as to also require a large-capacitance image memory. The electro-optical apparatus also requires high resolution.

Related art mobile instruments allow for information obtained from Internet to be displayed on a mobile display. When digitalized terrestrial broadcasting is delivered in accordance with MPEG-4 (motion picture experts groups-4) in the future, television images can be viewed and listened on the mobile display. Since the communication speed over a radio communication network for mobile instruments including a mobile phone network, is slower than those over an ADSL (asymmetric digital subscriber line) and a FITH (fiber to the home), it is preferable that high-quality images can be displayed with as lower capacitance data as possible. However, both images and line drawings cannot be compatibly displayed.

On the other hand, for fixed appliances, such as televisions and personal computers, the environment in that high-quality images can be obtained through a massive high-speed communication network and digital broadcasting is going to be prepared. However, since human sensibility in visual characteristics is higher in the horizontal and vertical directions, there is a problem in that with a square pixel arrangement, the pixel structure is perceivable even using high-resolution data. Thus, apparatuses capable of compatibly displaying both images and line drawings in high quality under any environment are required.

In related art documents, instead of a delta arrangement of square pixels, a technique has been proposed in that lines in horizontal and vertical directions, which are perceivable with square pixels, are reduced by aligning pseudo-hexagonal pixels in a delta arrangement so as to form a so-called honeycomb structure using hexagonal or a number of pixels, as disclosed in related art document Japanese Unexamined Patent Application Publication No. 9-233383 (P. 4 to 5, FIG. 4).

In order to enhance or improve the display quality of character data in the delta arrangement, related art documents disclose a structure that includes color filters arranged corresponding to pixel electrodes aligned in a stripe arrangement, each having an area smaller than that of the pixel electrode, so that centers of the color filters are aligned in a substantial delta arrangement, see for example related art document Japanese Unexamined Patent Application Publication No. 2001-337317 (P. 3, FIG. 1).

In electro-optical apparatuses such as organic EL devices, a technique of aligning sub-pixels in a delta arrangement has been disclosed in related art document Japanese Unexamined Patent Application Publication No. 2002-221917 (P. 3, FIG. 1), for example.

SUMMARY OF THE INVENTION

The system disclosed in Japanese Unexamined Patent Application Publication No. 9-233383 (P. 4 to 5, FIG. 4) is suitable for displaying images, such as natural paintings, and in particular the affinity thereof toward an imaging system is high. However, effective steps to display line drawings, such as characters, are not taken yet. The method is disclosed for displaying pseudo-hexagonal blocks with a number of square pixels; however, no technical ideas of using sub-pixels are disclosed. This method is not practical because a display with very high resolution is required for forming pseudo-hexagonal blocks with a number of square pixels.

In the method disclosed in Japanese Unexamined Patent Application Publication No. 2001-337317 (P. 3, FIG. 1), there is a problem of dark display because of a small area contributing to brightness. The method also has problems that the pixel structure is perceivable because of a square pixel and reduction in display quality since the arrangement is not strictly delta.

In the electro-optical apparatus disclosed in Japanese Unexamined Patent Application Publication No. 2002-221917 (P. 3, FIG. 1), sub-pixels are aligned in the delta arrangement; however, no technical ideas are disclosed in that the sub-pixels are provided by dividing pixels aligned in the delta arrangement. Hence, in related art electro-optical apparatuses, there is a problem that the arrangement of switching elements, such as TFTs (thin film transistors), is complicated.

Exemplary embodiments of the present invention address the above and/or other problems. Exemplary embodiments of the invention include a pixel structure, an electro-optical apparatus, and an electronic instrument, which are capable of clearly displaying both images, such as natural paintings, and line drawings, such as characters, with a very simple structure.

A pixel structure according to exemplary embodiments of the present invention includes a plurality of pixels disposed in a delta arrangement, each of the plurality of pixels having four sub-pixels that are four divisions divided from the pixel, and divided sides of the sub-pixels are arranged in a vertical direction or in a horizontal direction.

According to this pixel structure, by a simple operation to change the selecting manner of sub-pixels, either a delta arrangement or a square arrangement can be selected. The square arrangement includes an arrangement, such as a stripe arrangement and a mosaic arrangement, in which pixels are linearly disposed in vertical and horizontal directions. Line drawing data such as characters, can be displayed with the square arrangement while image data such as natural paintings can be displayed with the delta arrangement. By the delta arrangement, the resolution at an oblique angle is enhanced or improved with low-capacitance image data, so that the natural paintings can be displayed in high quality. By the square arrangement, since sub-pixel displacement is repeated in the vertical direction or the horizontal direction, the resolution is excellent. By the pixel structure according to exemplary embodiments of the present invention, with very simple pixel structure, both the images and the line drawings can be clearly displayed.

Another pixel structure according to exemplary embodiments of the present invention includes a plurality of pixels disposed in a delta arrangement, each of the plurality of pixels having two sub-pixels that are two divisions divided from the pixel, and divided sides of the sub-pixels are arranged in a vertical direction or in a horizontal direction.

According to this pixel structure, in the same manner as the above, by a simple operation to change the selecting manner of sub-pixels, either a delta arrangement or a vertical or horizontal linear arrangement can be selected. Image data such as natural paintings can be displayed with the delta arrangement. By the delta arrangement, the resolution at an oblique angle is enhanced or improved even with low-capacitance image data, so that the natural paintings can be displayed in high quality. Also, line drawing data such as characters can be displayed with the linear arrangement more clearly than with the delta arrangement. By the pixel structure according to exemplary embodiments of the present invention, with a very simple pixel structure, both the images and the line drawings can be clearly displayed.

In the pixel structures described above, it is preferable that the pixel be hexagonal in shape and the sub-pixel be trapezoidal in shape. Thus, adjacent pixels can be arranged in close contact together and moreover, the pixel can easily be divided into sub-pixels.

An electro-optical apparatus according to exemplary embodiments of the present invention includes a plurality of pixels disposed in a delta arrangement, each of the plurality of pixels having four sub-pixels that are four divisions divided from the pixel, and divided sides of the sub-pixels are arranged in a vertical direction or in a horizontal direction; and a controller to selectively achieve a delta arrangement and a square arrangement by switching the selection manner of the plurality of sub-pixels.

According to this electro-optical apparatus, by a function of the controlling means, the selecting manner of the sub-pixels can easily be switched, so that by this simple operation, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, by the electro-optical apparatus according to the exemplary embodiment of the present invention, with a very simple pixel structure, both the images and the line drawings can be clearly displayed.

Another electro-optical apparatus according to an exemplary embodiment of the present invention includes a plurality of pixels disposed in a delta arrangement, each of the plurality of pixels having two sub-pixels that are two divisions divided from the pixel, and divided sides of the sub-pixels being arranged in a vertical direction or in a horizontal direction; and a controller to selectively achieve a delta arrangement and a linear arrangement by switching the selection manner of the plurality of sub-pixels.

According to this electro-optical apparatus, by a function of the controlling means, the selecting manner of the sub-pixels can easily be switched, so that by this simple operation, either a delta arrangement or a linear arrangement can be selected. Image data such as natural paintings can be displayed with the delta arrangement. By the delta arrangement, the resolution at an oblique angle is enhanced or improved even with low-capacitance image data, so that the natural paintings can be displayed in high quality. Also, line drawing data such as characters can be displayed with the linear arrangement more clearly than with the delta arrangement. In other words, by the pixel structure according to an exemplary embodiment of the present invention, with a very simple pixel structure, both the images and the line drawings can be clearly displayed.

Still another electro-optical apparatus according to an exemplary embodiment of the present invention includes a plurality of pixels disposed in a delta arrangement, each of the plurality of pixels having four sub-pixels that are four divisions divided from the pixel, and divided sides of the sub-pixels being arranged along a vertical direction or in a horizontal direction, an R-colored ray, a G-colored ray, and a B-colored ray being provided corresponding to the four sub-pixels, respectively, so as to have color display by a spatial additive mixture of color.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced improved even with low-capacitance image data, so that the natural paintings can be displayed in high quality. By the square arrangement, since sub-pixel displacement is repeated in the vertical direction or the horizontal direction, the resolution is excellent. In other words, according to the electro-optical apparatus of the present invention, with a very simple pixel structure, both the images and the line drawings can be clearly displayed.

By this configuration, in both the square and delta arrangements, one pixel is displayed with R, G, G, and B colors. Since human eyes have a high luminosity factor for the G-color, by arranging two G-colors, excellent display can be obtained. In the square arrangement, the sub-pixels can form a periodic structure in that sub-pixels are displaced by ½ pixels, so that resolution is excellent.

Still another electro-optical apparatus according to an exemplary embodiment of the present invention includes a plurality of pixels disposed in a delta arrangement, each of the plurality of pixels having four sub-pixels that are four divisions divided from the pixel, and divided sides of the sub-pixels being arranged in a vertical direction or in a horizontal direction, different four colors being arranged corresponding to the four sub-pixels, respectively, so as to have color display by a spatial additive mixture of color process.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of the exemplary embodiment of the present invention, with a very simple pixel structure, both the images and the line drawings can be clearly displayed.

By this configuration, in both the square and delta arrangements, one pixel is displayed with different four colors. As for the different four colors, besides the three primary RGB colors, when W (white) is added as the fourth color, high brightness and electric power saving can be achieved. If the fourth color is selected other than the white, the color reproduction range is increased.

Still another electro-optical apparatus according to exemplary embodiments of the present invention includes a plurality of pixels disposed in a delta arrangement, each of the plurality of pixels including four sub-pixels that are four divisions divided from the pixel, and divided sides of the sub-pixels are arranged in a vertical direction or in a horizontal direction; and light valves provided respectively corresponding to an R-colored ray, a G-colored ray, and a B-colored ray, color images are displayed by an integral additive mixture of color using the light valves.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of exemplary embodiments of the present invention, with a very simple pixel structure, both the images and the line drawings can be clearly displayed.

By this configuration, in a projector with a large screen, since the pixel structure is difficult to be perceived in the vertical and horizontal directions, the projector is suitable especially for viewing images at a home theater.

Still another electro-optical apparatus according to exemplary embodiments of the present invention includes a plurality of pixels disposed in a delta arrangement, each of the plurality of pixels including two sub-pixels that are two divisions divided from the pixel, and divided sides of the sub-pixels are arranged in a vertical direction or in a horizontal direction; and light valves provided respectively corresponding to an R-colored ray, a G-colored ray, and a B-colored ray, color images being displayed by an integral additive mixture of color using the light valves.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of exemplary embodiments of the present invention, with a very simple pixel structure, both the images and the line drawings can be clearly displayed.

By this configuration, in a projector with a large screen, since the pixel structure is difficult to be perceived in the vertical and horizontal directions, the projector is suitable especially for viewing images at a home theater.

Still another electro-optical apparatus according to exemplary embodiments of the present invention includes a plurality of pixels disposed in a delta arrangement, each of the plurality of pixels including four sub-pixels that are four divisions divided from the pixel, and divided sides of the sub-pixels being arranged in a vertical direction or in a horizontal direction; and light valves, color images being displayed by supplying an R-colored ray, a G-colored ray, and a B-colored ray to the light valves with a time-sharing system using an integral additive mixture of color.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of exemplary embodiments of the present invention, with a very simple pixel structure, both the images and the line drawings can be clearly displayed.

By this configuration, since the pixel structure is also difficult to be perceived in the vertical and horizontal directions, the apparatus is suitable especially for viewing images at a home theater.

Still another electro-optical apparatus according to an exemplary embodiment of the present invention includes a plurality of pixels disposed in a delta arrangement, each of the plurality of pixels including two sub-pixels that are two divisions divided from the pixel, and divided sides of the sub-pixels being arranged in a vertical direction or in a horizontal direction; and light valves, color images being displayed by supplying an R-colored ray, a G-colored ray, and a B-colored ray to the light valves with a time-sharing system using an integral additive mixture of color.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of the present invention, with a very simple pixel structure, both the images and the line drawings can be clearly displayed.

By this configuration, since the pixel structure is also difficult to be perceived in the vertical and horizontal directions, the apparatus is suitable especially for viewing images at a home theater.

Still another electro-optical apparatus according to an exemplary embodiment of the present invention includes a plurality of pixels disposed in a delta arrangement, each of the plurality of pixels including four sub-pixels that are four divisions divided from the pixel, and divided sides of the sub-pixels being arranged in a vertical direction or in a horizontal direction, color images being displayed by an integral additive mixture of color using four or more colors.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of the present invention, with a very simple pixel structure, both the images and the line drawings can be clearly displayed.

By this configuration, since in addition to that the pixel structure is difficult to be perceived in the vertical and horizontal directions, color reproduction is excellent because of multi-primary colors, the apparatus is suitable especially for viewing images at a home theater.

Still another electro-optical apparatus according to an exemplary embodiment of the present invention includes a plurality of pixels disposed in a delta arrangement, each of the plurality of pixels including two sub-pixels that are two divisions divided from the pixel, and divided sides of the sub-pixels being arranged in a vertical direction or in a horizontal direction, color images being displayed by an integral additive mixture of color using four or more colors.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of the present invention, with a very simple pixel structure, both the images and the line drawings can be clearly displayed.

By this configuration, since in addition to that the pixel structure is difficult to be perceived in the vertical and horizontal directions, color reproduction is excellent because of multi-primary colors, the apparatus is suitable especially for viewing images at a home theater.

Still another electro-optical apparatus according to an exemplary embodiment of the present invention includes a plurality of pixels disposed in a delta arrangement, each of the plurality of pixels including four sub-pixels that are four divisions divided from the pixel, and divided sides of the sub-pixels being arranged along a vertical direction or in a horizontal direction, multiple-gradated images being displayed by area coverage gradation using the sub-pixels.

According to this pixel structure, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of the exemplary embodiment of the present invention, with a very simple pixel structure, both the images and the line drawings can be clearly displayed.

Also, in addition to tone display due to conventional amplitude modulation and time modulation, multiple-gradated images can be displayed by area coverage gradation due to combination of sub-pixel gradations.

Still another electro-optical apparatus according to an exemplary embodiment of the present invention includes a plurality of pixels disposed in a delta arrangement, each of the plurality of pixels including two sub-pixels that are two divisions divided from the pixel, and divided sides of the sub-pixels being arranged in a vertical direction or in a horizontal direction, multiple-gradated images being displayed by area coverage gradation using the sub-pixels.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of the exemplary embodiment of present invention, with a very simple pixel structure, both the images and the line drawings can be clearly displayed.

Also, in addition to tone display due to related art amplitude modulation and time modulation, multiple-gradated images can be displayed by area coverage gradation due to combination of sub-pixel gradations.

Still another electro-optical apparatus according to an exemplary embodiment of the present invention includes a plurality of pixels disposed in a delta arrangement, each of the plurality of pixels including four sub-pixels that are four divisions divided from the pixel, and divided sides of the sub-pixels being arranged in a vertical direction or in a horizontal direction; pixel electrodes, each being analogous with the sub-pixel in shape; and wiring formed on the backside of the pixel electrodes viewed in an observation direction, the sub-pixels being formed by the pixel electrodes, and the wiring includes straight wiring passing through the sub-pixels viewed in the observation direction.

According to this electro-optical apparatus, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of exemplary embodiments of the present invention, with a very simple pixel structure, both the images and the line drawings can be clearly displayed.

In this configuration, since routing of wiring does not affect the display, the wiring can be freely patterned regardless of arrangement of the pixel electrodes. Hence, the wiring can be laid out in the shortest distance, resulting in reduction in time constant and suppression of signal delay.

Still another electro-optical apparatus according to an exemplary embodiment of the present invention includes a plurality of pixels disposed in a delta arrangement, each of the plurality of pixels including two sub-pixels that are two divisions divided from the pixel, and divided sides of the sub-pixels being arranged in a vertical direction or in a horizontal direction; pixel electrodes, each being analogous with the sub-pixel in shape; and wiring formed on the backside of the pixel electrodes viewed in an observation direction, the sub-pixels being formed by the pixel electrodes, and the wiring includes straight wiring passing through the sub-pixels viewed in the observation direction.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of an exemplary embodiment of the present invention, with a very simple pixel structure, both the images and the line drawings can be clearly displayed.

In this configuration, since routing of wiring does not affect the display, the wiring can be freely patterned regardless of arrangement of the pixel electrodes. Hence, the wiring can be laid out in the shortest distance, resulting in reduction in time constant and suppression of signal delay.

Preferably, the electro-optical apparatus structured as described above includes a transparent electrode, a liquid crystal layer, a wiring layer, and a light-reflection layer viewed in the observation direction. The electro-optical apparatus structured in such a manner uses a liquid crystal layer as an electro-optical substance. By this configuration, the wiring under the light-reflection layer does not affect the display.

Preferably, the electro-optical apparatus structured as described above includes a transparent electrode, an EL layer, and a wiring layer viewed in the observation direction. The electro-optical apparatus structured in such a manner uses an organic EL layer as an electro-optical substance. By this configuration, the wiring under the organic EL layer does not affect the display.

Still another electro-optical apparatus according to an exemplary embodiment of the present invention includes a plurality of pixels disposed in a delta arrangement, each of the plurality of pixels including four sub-pixels that are four divisions divided from the pixel, and divided sides of the sub-pixels being arranged in a vertical direction or in a horizontal direction; pixel electrodes, each being analogous with the sub-pixel in shape; and wiring arranged along boarders of the pixel electrodes.

According to this pixel structure, by a simple operation of only changing the selecting manner of the sub-pixels, either a delta arrangement or a square arrangement can be selected. Line drawing data such as characters can be displayed with the square arrangement while image data such as natural paintings can be displayed with the delta arrangement. By the delta arrangement, the resolution at an oblique angle is enhanced or improved even with low-capacitance image data, so that the natural paintings can be displayed in high quality. By the square arrangement, since sub-pixel displacement is repeated in the vertical direction or the horizontal direction, the resolution is excellent. In other words, according to the pixel structure of an exemplary embodiment of the present invention, with a very simple pixel structure, both the images and the line drawings can be clearly displayed.

In this configuration, since the wiring is arranged along the boarders of the electrodes corresponding to the sub-pixels, bad influence due to the wiring on the display with the sub-pixel electrodes can be reduced. This configuration is suitable for a bottom-emission EL device in that a transmission liquid crystal device and the wiring are located closer to an observer than the sub-pixel electrodes, for example.

Still another electro-optical apparatus according to an exemplary embodiment of the present invention includes a plurality of pixels disposed in a delta arrangement, each of the plurality of pixels including two sub-pixels that are two divisions divided from the pixel, and divided sides of the sub-pixels being arranged in a vertical direction or in a horizontal direction; pixel electrodes, each being analogous with the sub-pixel in shape; and wiring arranged along boarders of the pixel electrodes.

According to this electro-optical apparatus, the selecting manner of the sub-pixels can be simply changed by an operation of a controller, and either a delta arrangement or a linear arrangement can be selected by this simple operation. Image data such as natural paintings can be displayed with the delta arrangement. By the delta arrangement, the resolution at an oblique angle is enhanced or improved even with low-capacitance image data, so that the natural paintings can be displayed in high quality. Line drawing data such as characters can be displayed with the linear arrangement more clearly than with the delta arrangement. In other words, according to the electro-optical apparatus of the present invention, with a very simple pixel structure, both the images and the line drawings can be clearly displayed.

In this configuration, since the wiring is arranged along the boarders of the electrodes corresponding to the sub-pixels, bad influence due to the wiring on the display with the electrodes corresponding to the sub-pixels can be reduced. This configuration is suitable for a bottom-emission EL device in that a transmission liquid crystal device and the wiring are located closer to an observer than the sub-pixel electrodes, for example.

In the electro-optical apparatus structured as described above so as to arrange wiring along borders of sub-pixel electrodes, it is preferable that a pair of pieces of wiring for sub-pixels adjacent to each other be linearly arranged along straight divided sides of the sub-pixels.

By such an arrangement, the wiring can be formed not in a zigzag line but linearly and thereby, laid out in the shortest distance, resulting in reduction in time constant and suppression of signal delay.

In the electro-optical apparatus according to all the exemplary embodiments described above, it is preferable that the pixel be hexagonal in shape while the sub-pixel be trapezoidal in shape. A so-called honeycomb arrangement is achieved by aligning a plurality of hexagonal pixels in a delta arrangement.

An electronic instrument according to exemplary embodiments of the present invention includes the electro-optical apparatus structured as described above; and a controller to control the operation of the electro-optical apparatus. As such an electronic instrument, there are a liquid crystal projector, a mobile phone, and a hand-held information terminal, for example.

BRIEF DESCRIPTION OF THE DRAWINGS

FIG. 1 is a plan view of a pixel structure according to an exemplary embodiment of the present invention;

FIG. 14 is a plan view showing the relationship between pixels and wiring which are essential parts of another exemplary embodiment of the electro-optical apparatus according to the present invention;

FIG. 17 is a plan view showing the relationship between pixels and wiring which are significant parts of still another exemplary embodiment of the electro-optical apparatus according to the present invention; and FIG. 18 is a plan view showing the relationship between pixels and wiring which are significant parts of still another exemplary embodiment of the electro-optical apparatus according to the present invention.

Figure 2:
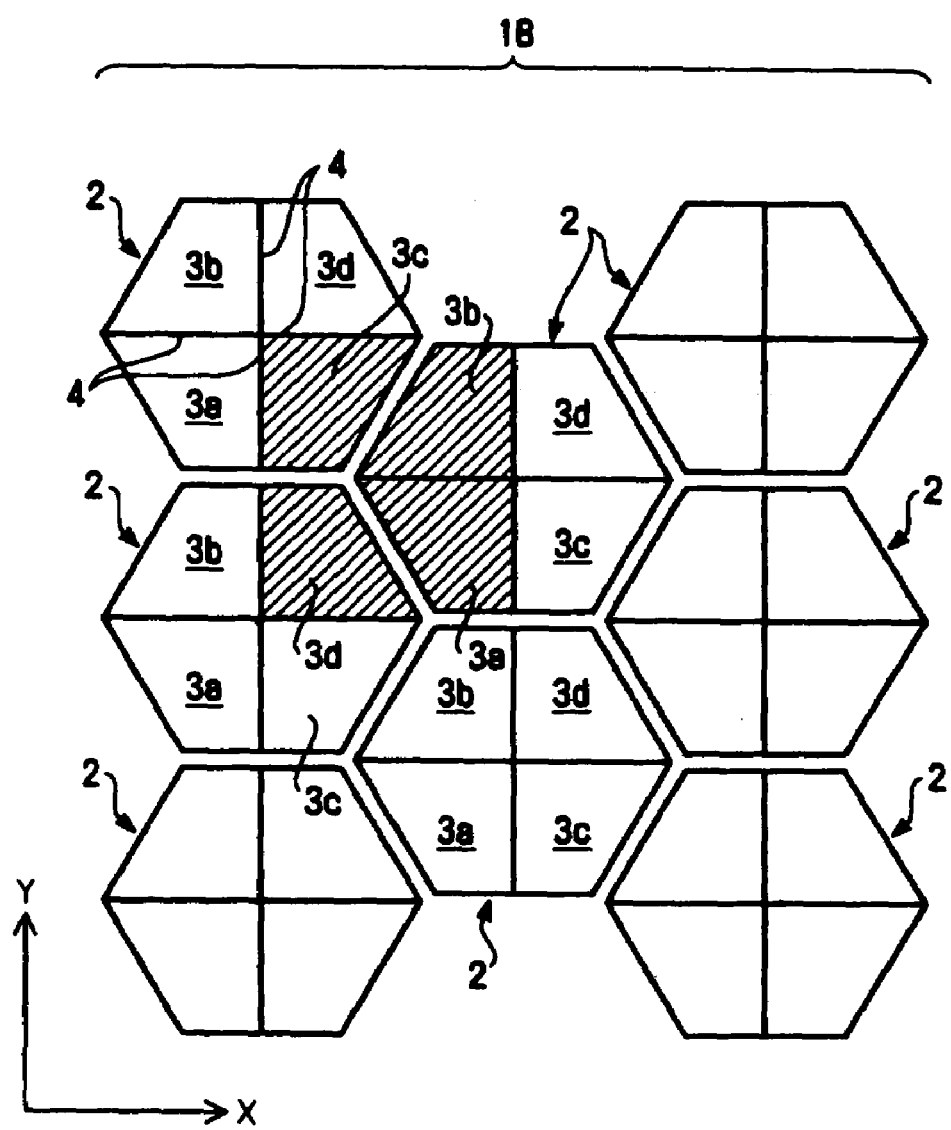
FIG. 2 is a plan view of a pixel structure according to another exemplary embodiment of the present invention.

DETAILED DESCRIPTION OF PREFERRED EMBODIMENTS (First Exemplary Embodiment of Pixel Structure)

A pixel structure according to an exemplary embodiment of the present invention will be described below. The present invention is not limited to this exemplary embodiment. FIG. 1 shows part of a planar structure of the pixel structure according to the exemplary embodiment of the present invention. A pixel structure 1A shown in the drawing is a so-called honeycomb arrangement by aligning a plurality of hexagonal pixels 2 in a delta arrangement. The delta arrangement is an arrangement with the center O of each pixel 2 positioned at an apex of a triangle T indicated by broken lines.

Each of the pixels 2 is formed by arranging four sub-pixels 3a, 3b, 3c, and 3d, which are four divisions divided from the pixel 2, so that divided sides 4 of the sub-pixels are contiguous to each other. In this case, the divided sides 4 are arranged along a vertical direction Y or a horizontal direction X. The vertical direction Y agrees with a column direction of a pixel arrangement while the horizontal direction agrees with a row direction thereof. The sub-pixels 3a to 3d are trapezoid-shaped by setting the divided sides 4 in such a manner in the pixels 2.

The pixel means a unit region when displaying images such as characters, numerals, and figures. The sub-pixel means a minimum display-dot unit for determining a state in that the pixel is lighted up. If one of the sub-pixels 3a to 3d is lighted, the pixel is displayed by the one lighted sub-pixel while if two thereof are lighted, the pixel is displayed by the two lighted sub-pixels. That is, the displaying state of the one pixel 2 is determined by the lighted sub-pixel or sub-pixels among the sub-pixels 3a to 3d.

When an electro-optic material, such as liquid crystal and organic EL (electro-luminescence), is cramped with a pair of electrodes, each of the sub-pixels 3a to 3d generally formulates a region in that these electrodes are two-dimensionally superimposed. That is, the sub-pixels 3a to 3d and the pixel 2 can be configured by forming the electrodes in shapes corresponding to those of these pixels. The planar shape of the pixel 2 is not limited to a hexagon, and it may be circular or polygonal.

In the pixel structure according to the exemplary embodiment, when a plurality of the pixels 2 are disposed in a delta arrangement for display, resolution at an oblique angle is thereby enhanced or improved with low-capacitance image data to have high-quality display, so that images such as natural fine paintings can be suitably displayed. On the other hand, the sub-pixel 3d in one pixel 2, the sub-pixel 3c in the pixel 2 adjacent to the one pixel 2 in the horizontal direction, and the sub-pixels 3a and 3b in another pixel 2 forming a delta arrangement in collaboration with these two pixels may also constitute one pixel. Such a pixel will be referred to a second pixel A below. Referring to FIG. 1, the one second pixel A is indicated by a shaded portion.

Each second pixel A is substantially square or substantially rectangular, and a plurality of the second pixels A are linearly aligned in both the vertical and horizontal directions Y and X. That is, a plurality of the second pixels A are disposed in a square arrangement. As a result, the display with a plurality of the second pixels A as pixels can depict a clear profile of line drawings such as characters and figures other than images such as natural paintings.

(Second Exemplary Embodiment of Pixel Structure)

FIG. 2 shows part of a planar structure of a pixel structure according to another exemplary embodiment of the present invention. The point of a pixel structure 1B shown in the drawing different from the pixel structure 1A is that the pixel 2 shown in FIG. 2 is in a state rotated by an angle of 90° from that of the pixel 2 shown in FIG. 1. According to the exemplary embodiment, the sub-pixel 3d in one pixel 2, the sub-pixel 3c in the pixel 2 adjacent to the one pixel 2 in the vertical direction, and the sub-pixels 3a and 3b in another pixel 2 forming a delta arrangement in collaboration with these two pixels may constitute one second pixel A shown by a shaded portion. A plurality of the second pixels A are linearly aligned in both the vertical and horizontal directions Y and X.

According to the exemplary embodiment shown in FIG. 2, it is identical to the exemplary embodiment shown in FIG. 1 that a plurality of the hexagonal pixels 2 are aligned in a delta arrangement, each of the pixels 2 is composed of four sub-pixels 3a, 3b, 3c, and 3d that are four divisions divided from the pixel 2, divided sides 4 of the sub-pixels are arranged in a vertical direction Y or in a horizontal direction X, and the sub-pixels 3a to 3d are trapezoidal shaped.

According to the pixel structure of the exemplary embodiment, in the course of display using a plurality of the pixels 2, a pixel structure is configured in a delta arrangement, and the resolution at an oblique angle is thereby enhanced or improved with low-capacitance image data to have high-quality display, so that images such as natural paintings can be suitably displayed. On the other hand, in the course of display using a plurality of the second pixels A aligned in a square arrangement, line drawings, such as characters and figures, other than the images can be displayed with clear contours.

(Third Exemplary Embodiment of Pixel Structure)

Figure 3:
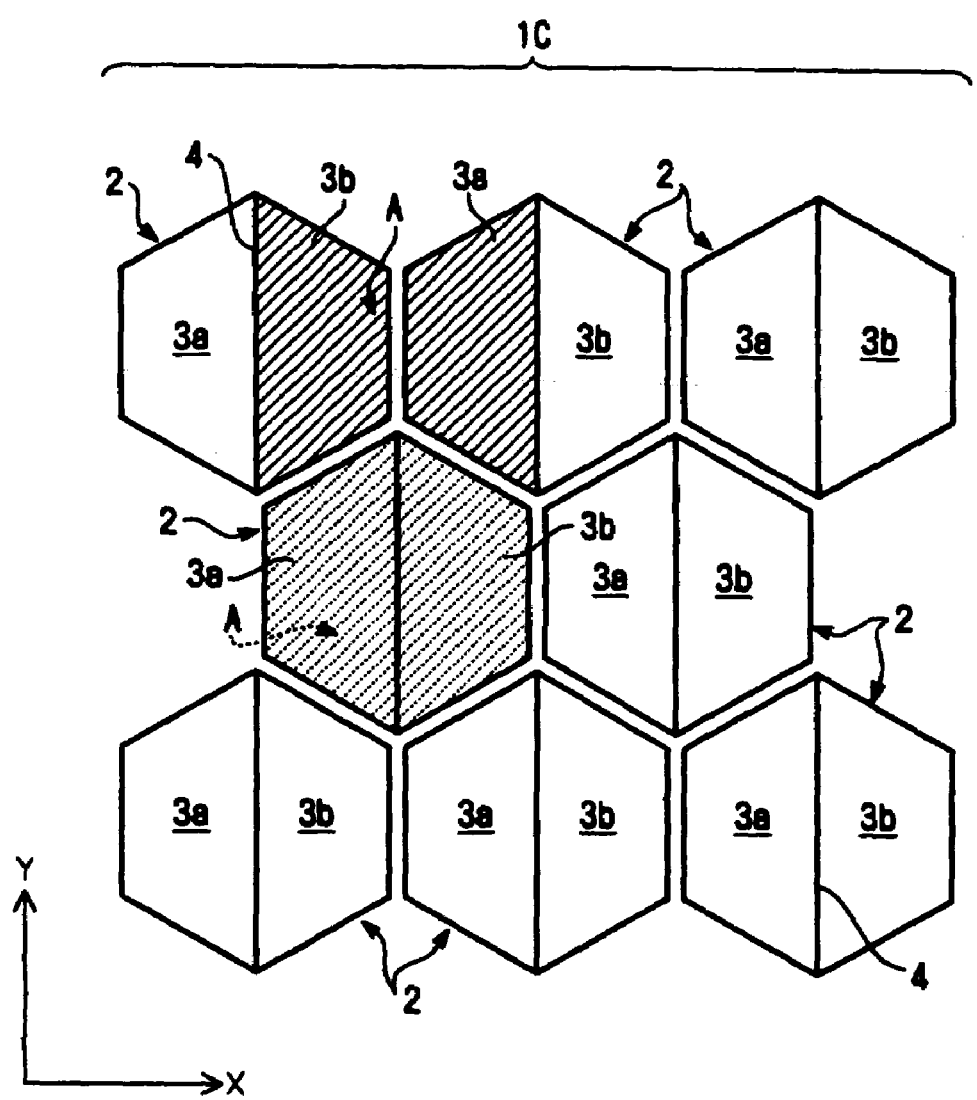
FIG. 3 is a plan view of a pixel structure according to still another exemplary embodiment of the present invention.

FIG. 3 shows part of a planar structure of a pixel structure according to still another exemplary embodiment of the present invention. The point of a pixel structure 1C shown in the drawing different from the pixel structure 1A shown in FIG. 1 is that in forming sub-pixels, the pixel 2 is divided into two divisions instead of dividing into four divisions. That is, according to the exemplary embodiment, two trapezoidal sub-pixels 3a and 3b constitute the one pixel 2.

According to the exemplary embodiment, a plurality of the pixels 2 are aligned in a delta arrangement. The second pixel A, as shown by solid oblique lines of FIG. 3, is composed of the sub-pixel 3b on the right of one pixel 2 and the sub-pixel 3a on the left of the pixel 2 adjacent to the one pixel 2 in the horizontal direction X. Alternatively, the second pixel A, as shown by broken oblique lines of FIG. 3, is composed of one pixel 2 itself. Thereby, a plurality of the second pixels A are linearly arranged in the vertical direction Y.

According to the pixel structure of the exemplary embodiment, in the course of display using a plurality of the pixels 2, a pixel structure is configured in a delta arrangement, and the resolution at an oblique angle is thereby enhanced or improved with low-capacitance image data to have high-quality display, so that images such as natural paintings can be suitably displayed. On the other hand, in the course of display using a plurality of the second pixels A linearly arranged in the vertical direction, line drawings, such as characters and figures, other than the images can be displayed with clear contours.

(Fourth Exemplary Embodiment of Pixel Structure)

Figure 4:
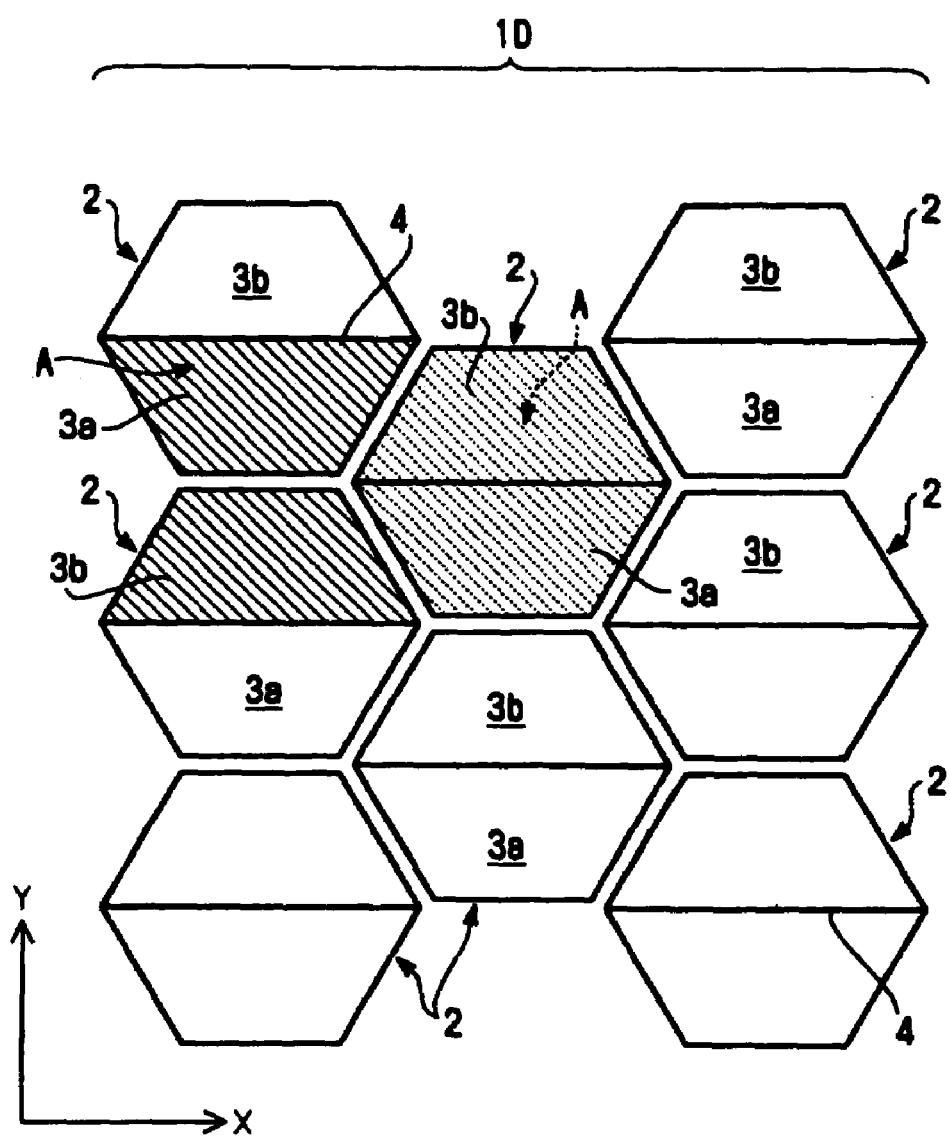
FIG. 4 is a plan view of a pixel structure according to still another exemplary embodiment of the present invention.

FIG. 4 shows part of a planar structure of a pixel structure according to still another exemplary embodiment of the present invention. In a pixel structure 1D shown in the drawing similar to the pixel structure shown in FIG. 3, two trapezoidal sub-pixels 3a and 3b constitute one pixel 2. The point of the pixel structure 1D different from the pixel structure 1C shown in FIG. 3 is that the pixel 2 shown in FIG. 4 is in a state rotated by an angle of 90° from that of the pixel 2 shown in FIG. 3.

According to the exemplary embodiment, a plurality of the pixels 2 are aligned in a delta arrangement. A second pixel A, as shown by solid oblique lines of FIG. 4, is composed of the sub-pixel 3a in a lower portion of one pixel 2 and the sub-pixel 3b in an upper portion of the pixel 2 adjacent to the one pixel 2 in the vertical direction Y Alternatively, the second pixel A, as shown by broken oblique lines, is composed of one pixel 2 itself. Thereby, a plurality of the second pixels A are linearly arranged in the horizontal direction X.

According to the pixel structure of the exemplary embodiment, in the course of display using a plurality of the pixels 2, a pixel structure is configured in a delta arrangement, and the resolution at an oblique angle is thereby enhanced or improved with low-capacitance image data to have high-quality display, so that images such as natural paintings can be suitably displayed. On the other hand, in the course of display using a plurality of the second pixels A linearly arranged in the horizontal direction, line drawings, such as characters and figures, other than the images can be displayed with clear contours.

(First Exemplary Embodiment of Electro-optical Apparatus)

Figure 5:
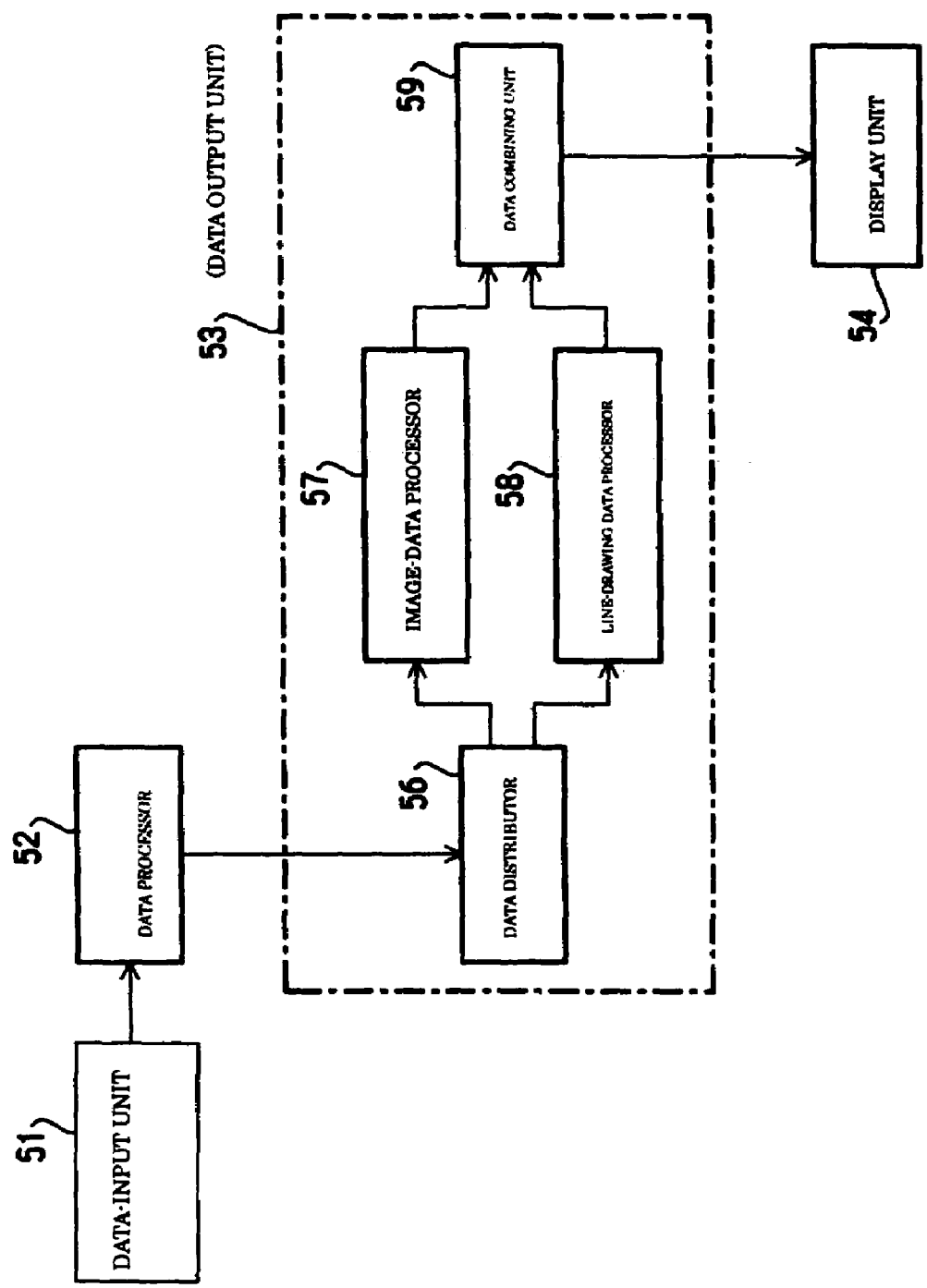
FIG. 5 is a schematic that shows an electro-optical apparatus according to an exemplary embodiment of the present invention.

FIG. 5 shows an electro-optical apparatus according to an exemplary embodiment of the present invention having a control circuit suitable for driving a pixel structure according to the present invention. The electro-optical apparatus includes a data-input unit 51 for feeding image data such as natural paintings and line-drawing data such as characters and numerals, a data processor 52 for uncompressing compressed data and for determining data whether the image data or the line-drawing data, a data output unit 53, and a display unit 54 for displaying images. The display unit 54 is for displaying images such as natural paintings and line drawings such as characters and numerals as screen images, and it may be structured using a CRT (cathode ray tube) and a liquid crystal device, for example.

The data output unit 53 includes a data distributor 56 for distributing the image data and the line-drawing data determined by the data processor 52, an image-data processor 57 for suitably processing the image data produced from one output terminal of the data distributor 56, a line-drawing data processor 58 for suitably processing the line-drawing data produced from the other output terminal of the data distributor 56, and a data combining unit 59 for combining the output data from the image-data processor 57 with the output data from the line-drawing data processor 58 so as to supply them to the display unit 54. The image-data processor 57 processes data for displaying them using a plurality of the pixels 2 aligned in a delta arrangement shown in FIG. 1, for example. On the other hand, the line-drawing data processor 58 processes data for displaying them using a plurality of the second pixels A aligned in a square arrangement shown in FIG. 1.

In a control circuit shown in FIG. 5, the image data and the line-drawing data are separately processed and combined together thereafter so as to produce them as output data.

Thereby, in accordance with a kind of data to be displayed, the selection between the delta arrangement and the square arrangement shown in FIGS. 1 and 2 can be made. Alternatively, the selection between the delta arrangement and the linear arrangement shown in FIGS. 3 and 4 can be made on demand. Accordingly, the data can be displayed with high quality. In addition, when the image data and the line-drawing data overlap with each other, it is preferable that the data combining unit 59 combine these data by determining which date are emphasized.

In view of information from Internet, the information is described with an expression language referred to as an HTML (hyper text markup language). In consideration of digital broadcasting acting as display data, the information is described with an expression language referred to as a BML (broad markup language). For example, when data are allocated so that the image data are displayed with the delta arrangement while the line-drawing data are displayed with the square arrangement or the linear arrangement, the respective data can be suitably displayed.

In an MPEG-2PS (moving picture experts group phase-2 program stream) used in a DVD (digital versatile disk) and the like, a plurality of ESs (elementary streams), which are audio compressed and coded data, are multiplexed. The image data and character data (i.e., the line-drawing data) such as captions can be allocated so as to suitably display them, respectively, because they are in ESs different from each other.

In an MPEG-2TS (moving picture experts group phase-2 transport stream) used in digital broadcasting and the like, the multiplexing method is different from the MPEG-2PS. However, since the image data and the character data are in PESs (packetized elementary streams) different from each other, these data can be allocated so as to suitably display them, respectively.

An MPEG-4 used for mobile phones divides a picture area into objects such as persons, backgrounds, characters, figures, and voices so as to be suitably coded, respectively, in a different way from the MPEG-2. Accordingly, in this case, data are allocated into the image data and the line-drawing data so as to suitably display them, respectively.

In analogous broadcasting, the image data and the character data are produced as one picture. It is, therefore, preferable that in order to suitably display the picture by allocating it into the image data and the character data, the image data and the character data be detected and processed with suitable processes, respectively.

(Second Exemplary Embodiment of Electro-optical Apparatus)

Figure 6:
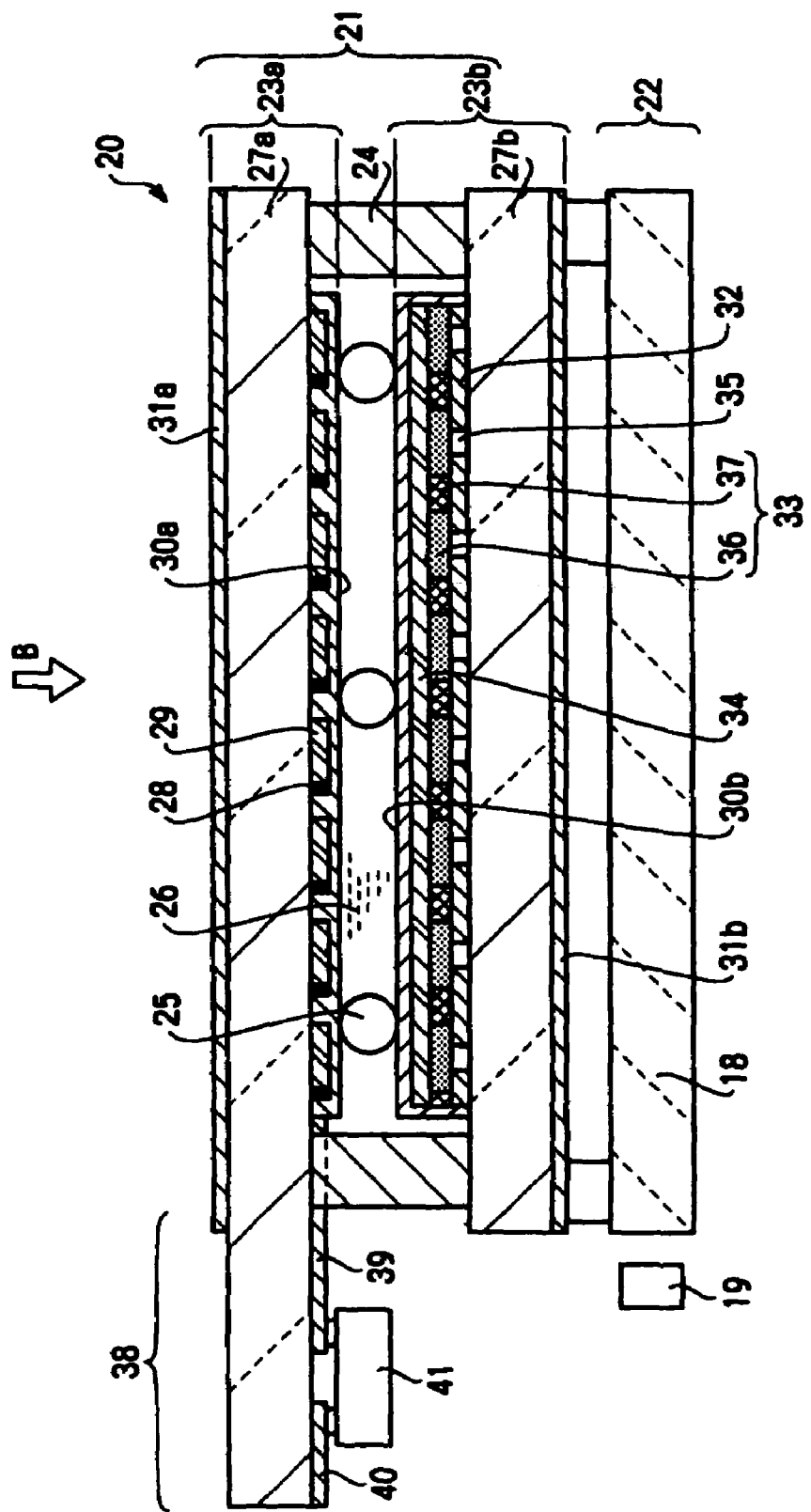
FIG. 6 is a sectional view of a liquid crystal device which is another exemplary embodiment of an electro-optical apparatus according to the present invention.
Figure 7:
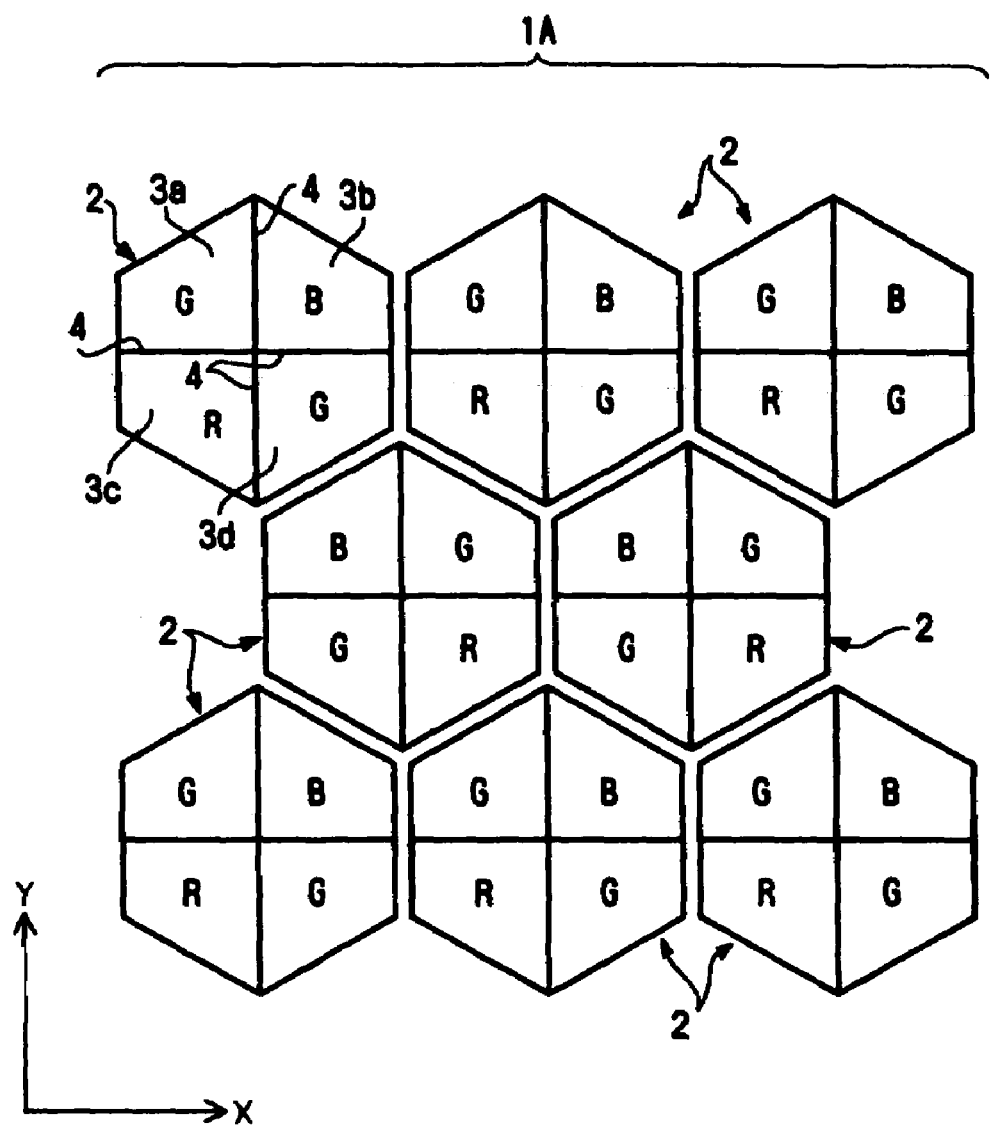
FIG. 7 is a plan view showing an example of the relationship between a pixel structure and light colors in the electro-optical apparatus shown in FIG. 6.

FIGS. 6 and 7 show an electro-optical apparatus according to a second exemplary embodiment of the present invention. According to this second exemplary embodiment, with a liquid crystal display, which is one of electro-optical apparatuses, incorporating the present invention, colors are displayed by a spatial additive mixture of color process. The spatial additive mixture of color process, as disclosed in related art documents, is a color displaying technique in that when a plurality of colors such as R, G, and B colors are arranged in close vicinity to each other without being overlapped with each other, a person perceives color mixture when seeing these colors.

The liquid crystal display may include an active-matrix liquid crystal display using a three-terminal active element, such as a TFT (thin film transistor), as a switching element; an active-matrix liquid crystal display using a two-terminal active element, such as a TFD (thin film diode), as a switching element; and a passive-matrix liquid crystal display without using a switching element. According to the exemplary embodiment, an active-matrix transflective display using the TFD is exemplified. Referring to FIGS. 6 and 7, various components are shown by being scaled down differently from original sizes for easier understanding.

A liquid crystal display 20 shown in FIG. 6 includes a liquid crystal panel 21 and an illumination device 22. The illumination device 22 includes a light source 19, composed of a cold-cathode tube and an LED (light emitting diode), etc., and a light guide plate 18 for introducing light from the light source 19 so as to radiate it as planar light. The liquid crystal panel 21 is constructed by bonding an element substrate 23*a* on an opposing substrate 23*b* with a sealing material 24 being square and annular viewed in an observing direction indicated by arrow B. Between both the substrates 23*a* and 23*b*, a micro clearance so-called as a cell gap is formed by being held with a spacer 25, so that liquid crystal is sealed within the cell gap as an electro-optical material so as to form a liquid crystal layer 26.

The element substrate 23*a* includes a base material 27*a* made of light-transmissive glass or light-transmissive plastic, and on a surface of the base material 27*a* adjacent to the liquid crystal, a TFD element 28, a pixel electrode 29, and an alignment layer 30*a* are formed. On the external surface of the base material 27*a*, a polarizer and other necessary optical elements 31*a* are provided. The alignment layer 30*a* is made of polyimide, etc., and orientation treatment such as rubbing is applied on the surface thereof.

The TFD element 28 has a three-layer deposited structure of first metal/insulator layer/second metal, that is a so-called MIM deposited structure of metal/insulator/metal, so that when a voltage with a predetermined threshold value or more is applied, the passage of electric current is permitted therethrough, i.e., switching action is allowed. Each pixel electrode 29 is constructed in a trapezoidal shape corresponding to each of the sub-pixels 3*a* to 3*d* shown in FIG. 1 so as to form the pixel 2 with collection of the trapezoidal pixel electrodes 29. The pixel electrode 29 is made of a transparent conductive material such as ITO (indium tin oxide).

Referring to FIG. 6, the opposing substrate 23*b* includes a base material 27*b* made of light-transmissive glass or light-transmissive plastic, and on a surface of the base material 27*b* adjacent to the liquid crystal, a light-reflection film 32, a color filter 33, stripe-geometry opposing electrodes 34, and an alignment layer 30*b* are provided. The alignment layer 30*b* is made of polyimide, etc., and orientation treatment such as rubbing is applied on the surface thereof. On the external surface of the base material 27*b*, a polarizer and other necessary optical elements 31*b* are provided.

The light-reflection film 32 is made of a light-reflective metallic material such as Al (aluminum). On the light-reflection film 32, openings 35 for light-transmission are formed at positions corresponding to the sub-pixels 3*a* to 3*d*. A light-reflection part of the light-reflection film 32 reflects light incident from the observing direction B so as to be fed to the liquid crystal layer 26 in a reflection display mode. On the other hand, the openings 35 formed in the light-reflection film 32 transmits planar light generated from the illumination device 22 so as to be fed to the liquid crystal layer 26 in a transmission display mode.

The color filter 33 is composed of coloration elements 36 of three colors R, G, and B arranged in a predetermine pattern viewed from the observing direction B and light-exclusion layers 37 formed so as to bridge between the coloration elements 36. The light-exclusion layer 37 is made of a light-exclusion material such as Cr (chromium). The coloration elements 36 are made of materials containing pigments and dyes corresponding to the RGB colors. According to the exemplary embodiment, the harmonious RGB color arrangement is determined by the relationship to the pixel electrode 29 adjacent to the element substrate 23a. Specifically, as shown in FIG. 7, colors R, G, G, and B are allocated for each of the sub-pixels 3a to 3d. More specifically, the G color is allocated to the sub-pixel 3a, the B color to the sub-pixel 3b, the R-color to the sub-pixel 3c, and the G-color to the sub-pixel 3d. In such a color arrangement, colors are displayed by the spatial additive mixture of color process. The reason why two G-colors are allocated in one pixel is that human eyes have a high luminosity factor for the G-color.

Referring to FIG. 6, one of the opposing electrodes 34 has a linear structure extending laterally in FIG. 6, i.e., in a band shape, and a plurality of the band electrodes are arranged perpendicularly to the plane of FIG. 6 in parallel with each other at appropriate intervals. Accordingly, a plurality of the opposing electrodes 34 are arranged in stripes viewed from the arrow direction B. The opposing electrode 34 is made of a transparent conductive material such as ITO.

The element substrate 23a includes an overhanging section 38 extending outside the opposing substrate 23b. In the overhanging section 38, wiring 39 is mounted, which extends inside the sealing material 24 to be connected to the pixel electrode 29 and the opposing electrodes 34. In the periphery of the overhanging section 38, an external connection terminal 40 is arranged to be electrically connected to an external circuit (not shown). On the surface of the overhanging section 38, a driving IC 41 is mounted, and an input bump of the driving IC 41 is connected to the external connection terminal 40 while an output bump is connected to the wiring 39. By the operation of the driving IC 41, a scanning signal and a data signal are applied to the pixel electrode 29 and the opposing electrodes 34.

In the liquid crystal device 20 according to the exemplary embodiment, in the course of display using a plurality of the pixels 2, a pixel structure is configured in the delta arrangement shown in FIG. 7, and the resolution at an oblique angle is thereby enhanced or improved with low-capacitance image data to have high-quality display, so that images such as natural paintings can be suitably displayed. On the other hand, in the course of display using a plurality of the second pixels A (see FIG. 1), a pixel structure is aligned in a square arrangement, such as a stripe arrangement and a mosaic arrangement, so that line drawings, such as characters and figures other than images, can be displayed with clear contours.

The pixel structure according to the exemplary embodiment is not limited to the pixel structure shown in FIG. 7, i.e., the pixel structure shown in FIG. 1. Alternatively, arbitrary pixel structures within the scope of the present invention, such as structures shown FIGS. 2 to 4, can be incorporated, for example.

(Third Exemplary Embodiment of Electro-optical Apparatus)

Figure 8:
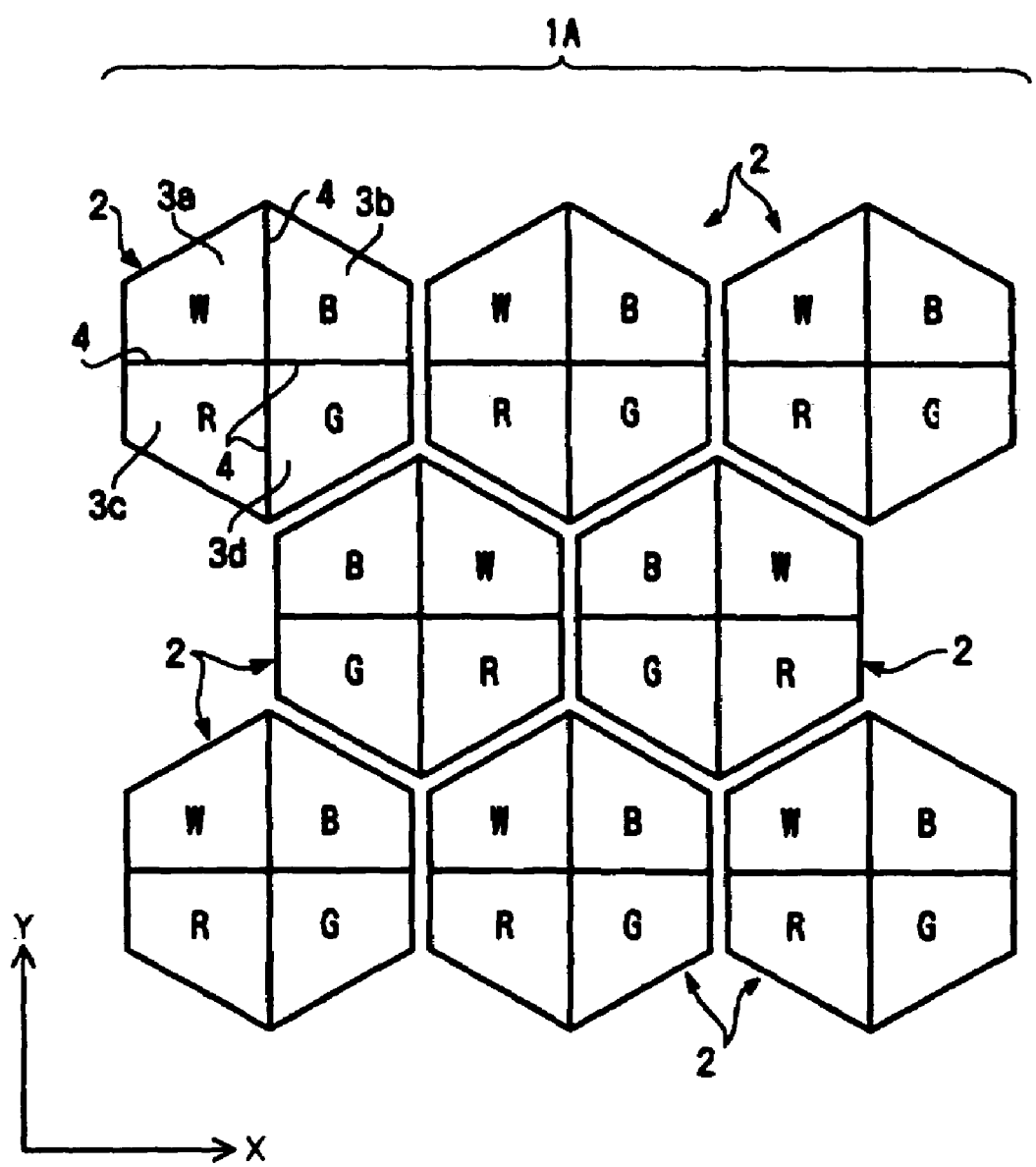
FIG. 8 is a plan view showing another example of the relationship between the pixel structure and the light colors in the electro-optical apparatus shown in FIG. 6.

FIG. 8 shows still another electro-optical apparatus according to a third exemplary embodiment of the present invention. According to this exemplary embodiment, although a display device is generally similar in construction to the previous display device shown in FIGS. 6 and 7, the arranging manner of each color ray is modified in a pixel structure 1A shown in FIG. 8. Specifically, according to the exemplary embodiment, entirely different colors are arranged in accordance with the sub-pixels 3a to 3d, respectively. For example, besides R, G, and B, a W-color (i.e., white) is added, the harmonious each color arrangement is determined by the relationship to the pixel electrode 29 shown in FIG. 6 and adjacent to the element substrate 23a. More specifically, as shown in FIG. 8, the W-color is allocated to the sub-pixel 3a, the B color to the sub-pixel 3b, the R-color to the sub-pixel 3c, and the G-color to the sub-pixel 3d. In such a color arrangement, colors are displayed by the spatial additive mixture of color process. According to the exemplary embodiment, by arranging the W-color, white can be brightly displayed. If the fourth color is selected other than the white, the color reproduction range is increased.

The pixel structure according to the exemplary embodiment is not limited to the pixel structure shown in FIG. 8, i.e., the pixel structure shown in FIG. 1. Alternatively, arbitrary pixel structures within the scope of the present invention, such as structures shown FIGS. 2 to 4, can be incorporated, for example.

(Fourth Exemplary Embodiment of Electro-optical Apparatus and First Exemplary Embodiment of Electronic Instrument)

An electronic instrument according to an exemplary embodiment of the present invention will now be described while still another exemplary embodiment of the electro-optical apparatus used in the electronic instrument will be described as well. The following exemplary embodiments relate to a liquid crystal device, which displays colors by an integral additive mixture of color using the pixel structure shown in FIG. 7, i.e., the pixel structure shown in FIG. 1, and a liquid crystal projector using the liquid crystal device. When the integral additive mixture of color is simply described, the spatial additive mixture of color process mentioned above does not overlap RGB colors in practice, whereas the integral additive mixture of color process is a technique of overlapping different colors in practice so as to display colors.

Figure 9:
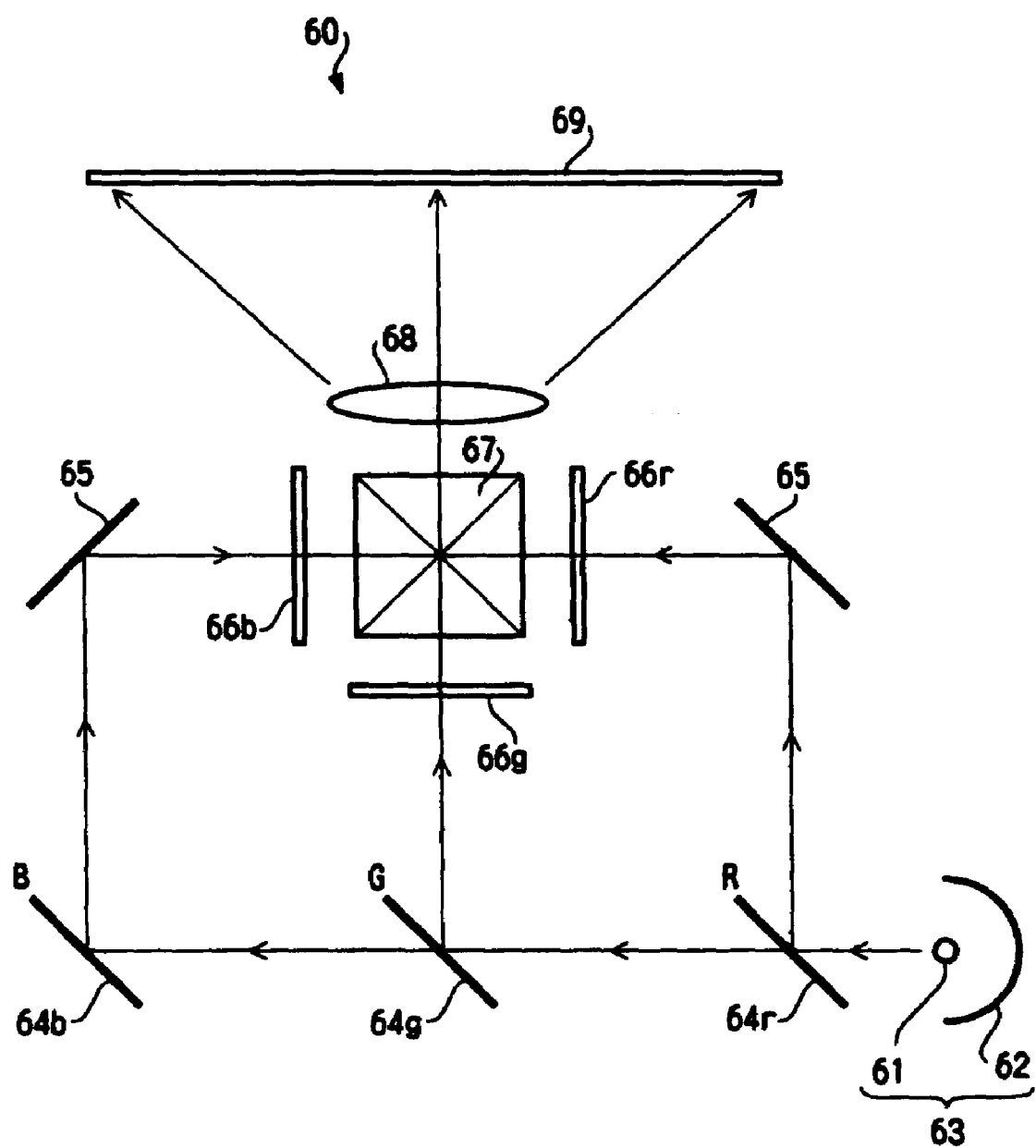
FIG. 9 is a schematic that shows the structure of a liquid crystal projector which is an exemplary embodiment of an electronic instrument according to the present invention.

FIG. 9 shows a liquid crystal projector as an example of an electronic instrument structured including a liquid crystal device achieving the integral additive mixture of color. A liquid crystal projector 60 includes a light source 63 for emitting light, a dichroic mirror 64r for reflecting R-color light while transmitting light with other wavelengths, a dichroic mirror 64g for reflecting G-color light while transmitting light with other wavelengths, a dichroic mirror 64b for reflecting B-color light while transmitting light with other wavelengths, a reflecting mirror 65, an R-color liquid crystal light valve 66r arranged on an optical path of the R-color light, a G-color liquid crystal light valve 66g arranged on an optical path of the G-color light, a B-color liquid crystal light valve 66b arranged on an optical path of the B-color light, a dichroic prism 67 for combining these colors together, a projection lens 68, and a screen 69. The light source 63 is composed of a lamp 61 for generating white-color light and a reflector 62.

According to the exemplary embodiment, the liquid crystal is composed of the liquid crystal light valves 66r, 66g, and 66b, and a light supply system for supplying to these light valves light with wavelengths corresponding thereto. According to the exemplary embodiment, the light supply system is constituted of the light source 63, the dichroic mirrors 64r, 64g, and 64b, and the reflecting mirror 65.

Figure 10:
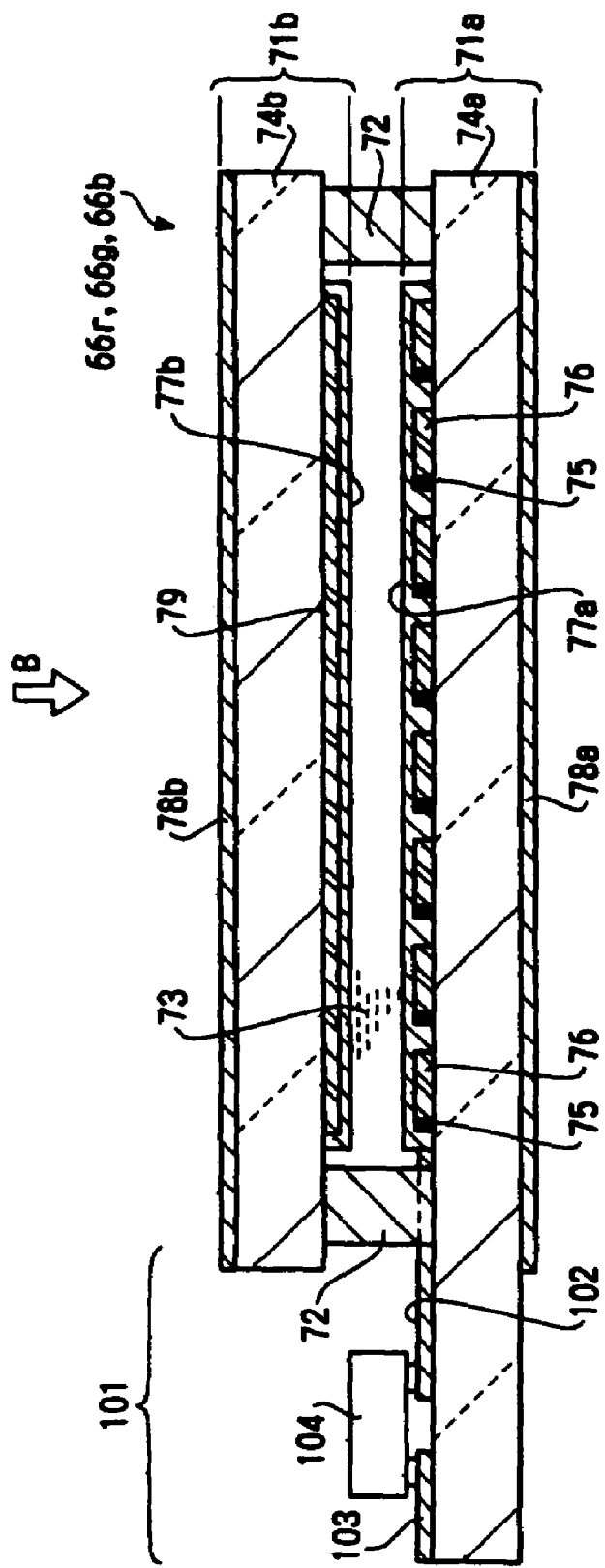
FIG. 10 is a sectional view showing an example of a liquid crystal light valve used in the liquid crystal projector shown in FIG. 9.

Each of the liquid crystal light valves 66r, 66g, and 66b, as shown in FIG. 10, is structured by bonding an element substrate 71a on an opposing substrate 71b with a sealing material 72 being square and annular viewed in an arrow B direction. Between both the substrates 71a and 71b, a micro clearance so-called as a cell gap is formed, so that liquid crystal is sealed within the cell gap as an electro-optical material so as to form a liquid crystal layer 73. The liquid crystal layer 73 is made of liquid crystal mixture of one or several kinds of nematic liquid crystal.

The element substrate 71a includes a base 74a made of light-transmissive glass or light-transmissive plastic, and on a surface of the base 74a adjacent to the liquid crystal, a TFT element 75, a pixel electrode 76, and an alignment layer 77a are formed. On the external surface of the base 74a, a polarizer and other necessary optical elements 78a are provided. The alignment layer 77a is made of polyimide, etc., and orientation treatment such as rubbing is applied on the surface thereof.

The opposing substrate 71b includes a base material 74b made of light-transmissive glass or light-transmissive plastic, and on a surface of the base material 74b adjacent to the liquid crystal, an opposing electrode 79 and an alignment layer 77b are provided. On the external surface of the base material 74b, a polarizer and other necessary optical elements 78b are provided. The opposing electrode 79 is made of a transparent conductive material, such as ITO, formed on the substantially entire surface of the effective display area as a common electrode. The alignment layer 77b is made of polyimide, etc., and orientation treatment such as rubbing is applied on the surface thereof.

A plurality of pixel electrodes 76 are formed on the surface of the element substrate 71a. Each of the pixel electrodes 76 is constructed in a trapezoidal shape corresponding to each of the sub-pixels 3a to 3d, shown in FIG. 1 for example, so as to form the pixel 2 with collection of the trapezoidal pixel electrodes 76. The pixel electrode 76 is made of a transparent conductive material such as ITO.

The element substrate 71a includes an overhanging section 101 extending outside the opposing substrate 71b. In the overhanging section 101, wiring 102 is mounted, which extends inside the sealing material 72 to be connected to the pixel electrode 76 and the opposing electrode 79. In the periphery of the overhanging section 101, an external connection terminal 103 is arranged to be electrically connected to an external circuit (not shown). On the surface of the overhanging section 101, a driving IC 104 is mounted, and an input bump of the driving IC 104 is connected to the external connection terminal 103 while an output bump is connected to the wiring 102. By the operation of the driving IC 104, a scanning signal and a data signal are applied to the pixel electrode 76 and the opposing electrode 79.

Figure 11:
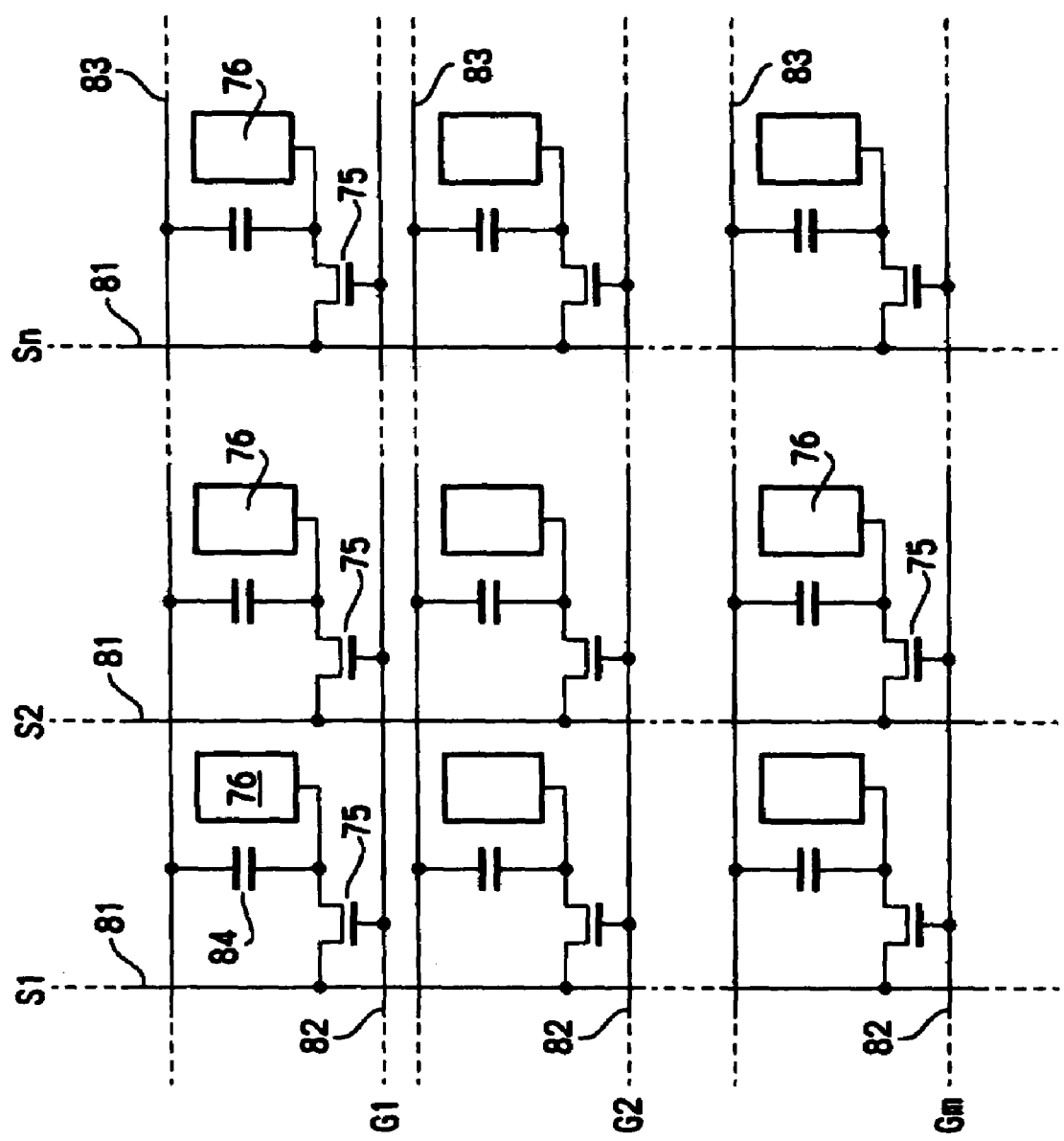
FIG. 11 is a schematic that shows a TFT element and various elements connected thereto used in the liquid crystal light valve shown in FIG. 10.
Figure 12:
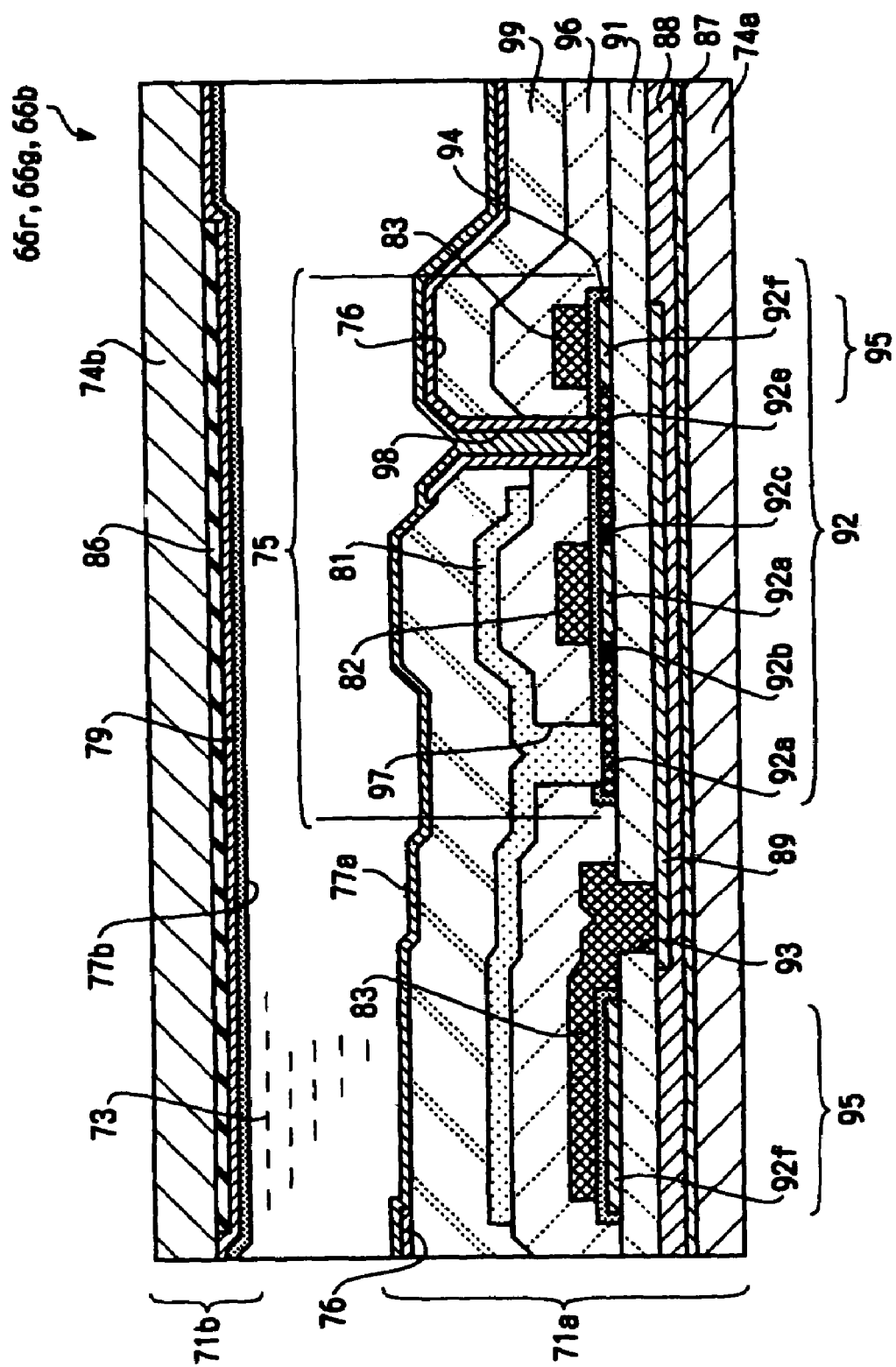
FIG. 12 is a sectional view showing an example of a specific structure of the TFT element shown in the equivalent circuit diagram shown in FIG. 11.

The TFT element 75 and the pixel electrode 76 formed on a surface of the element substrate 71a adjacent to the liquid crystal will be simply described below. FIG. 11 shows an equivalent circuit of the TFT element 75, the pixel electrode 76, and various appending elements. FIG. 12 shows a sectional structure of the vicinity of the TFT element 75 on the element substrate 71a. In FIG. 12, various components are shown by being scaled down differently from original sizes for easier understanding.

Referring to FIG. 11, there are provided data lines 81 which are wires for supplying image signals S1, S2, . . . , Sn. There are also provided scanning lines 82 which are wires for supplying scanning signals G1, G2, . . . , Gn, and capacitance lines 83. The source of the TFT element 75 is connected to the data line 81 while the gate of the TFT element 75 is connected to the scanning line 82. The pixel electrode 76 is connected to the drain of the TFT element 75.

By closing the TFT element 75 for a predetermined period of time, the image signals S1, S2, . . . , Sn supplied from the data lines 81 are written at predetermined timing. The written image signals are held between the opposing substrate and the opposing electrode formed thereon for a predetermined period of time.

In order to prevent reduction in a contrast ratio and blinking called as flicker due to leak of the held image signals, a storage capacitance 84 is added to a liquid crystal capacitance in parallel therewith, which is formed between the pixel electrode 76 and the opposing electrode 79 (see FIG. 10). In order to form such a storage capacitance 84, the capacitance lines 83 are provided along the same layer as that of the scanning lines 82.

Referring to FIG. 12, a sectional structure of the vicinity of the TFT element 75 shown in FIG. 10 will now be described. In the drawing, the element substrate 71a includes a base 74a made of quartz, the pixel electrodes 76, the TFT element 75, and the alignment layer 77a. The TFT element 75 controls the switching of the pixel electrodes 76. On the other hand, the opposing substrate 71b includes a base 74b made of a light-transmissive material such as transparent glass or transparent quartz, and on a surface of the base 74b adjacent to the liquid crystal, an opposing-substrate light-exclusion layer 86, the opposing electrode 79, and the alignment layer 77b are arranged.

The element substrate 71a uses a composite substrate made by bonding a monocrystal silicon substrate on the base 74a, for example, and a boundary between a lower bonding film 87 on a surface of the base 74a adjacent to the liquid crystal and an upper bonding film 88 formed on the lower bonding film 87 is a bonding interface between the base 74a and a semiconductor substrate. At positions on the surface of the upper bonding film 88 corresponding to the TFT elements 75, light-exclusion layers 89 made of an opaque metal with a high melting point, such as Ti and Cr, are embedded. The light-exclusion layer 89 is formed on a surface, to be bonded on the base 74a, of the monocrystal silicon substrate, and then, by bonding the monocrystal silicon substrate on the base 74a, the light-exclusion layer 89 is formed on the base 74a. Accordingly, the light-exclusion layer 89 is embedded in the monocrystal silicon substrate by the upper bonding film 88 formed so as to cover the light-exclusion layer 89.

On the upper bonding film 88 and the light-exclusion layer 89, a first interlayer-insulating film 91 is provided. The first interlayer-insulating film 91 is provided on the entire surface of the base 74a for electrically insulating a semiconductor layer 92 constituting the TFT element 75 from the light-exclusion layer 89. The first interlayer-insulating film 91 also prevents the light-exclusion layer 89 from contaminating the TFT element 75. In addition, it is obvious that the element substrate 71a can be made by a related art high-temperature polycrystal silicon process without using the composite substrate.

The light-exclusion layer 89 and the capacitance line 83 electrically connected thereto are at constant potential by being electrically connected to a constant potential source via a contact hole 93 penetrating the first interlayer-insulating film 91 so as to reach the light-exclusion layer 89. Accordingly, changes in potential of the light-exclusion layer 89 cannot adversely affect the TFT element 75 arranged to oppose the light-exclusion layer 89.

A gate insulating film 94 extends from a position opposing the scanning line 82 so as to be used as a dielectric film; a semiconductor film 92 is extended to have a first storage capacitance electrode 92f; and further, a storage capacitance 95 is formed by making part of the capacitance line 83 opposing these components a second storage capacitance electrode. More in detail, a high-density drain region 92e of the semiconductor film 92 extends under the data line 81 and the scanning line 82 so as to be arranged to oppose part of the capacitance line 83 extending along the data line 81 and the scanning line 82 with the insulating film 94 therebetween for having the first storage capacitance electrode 92f. In particular, since the insulating film 94 as a dielectric body of the storage capacitance 95 is none other than the gate insulating film 94 of the TFT element 75 formed on a monocrystal semiconductor layer by high-temperature oxidation, a thin insulating film with a high-pressure resistance can be obtained, so that the storage capacitance 95 can have a large capacitance with a comparably small area.

The TFT element 75, having an LDD (lightly doped drain) structure, includes the scanning line 82, a channel region 92a of the semiconductor film 92 having a channel by an electric field from the scanning line 82, the gate insulating film 94 for insulating the scanning line 82 from the semiconductor film 92, the data line 81, a low-density source region (i.e., a source-side LDD region) 92b of the semiconductor film 92, a low-density drain region (i.e., a drain-side LDD region) 92c, a high-density source region 92d of the semiconductor film 92, and a high-density drain region 92e.

On the scanning line 82, the gate insulating film 94, and the first interlayer-insulating film 91, a second interlayer-insulating film 96 is formed. The second interlayer-insulating film 96 is provided with a contact hole 97 and a contact hole 98 formed thereon and connected to the high-density source region 92d and the high-density drain region 92e, respectively. The data line 81 is electrically connected to the high-density source region 92d via the contact hole 97 intercommunicating with the high-density source region 92d. On the data line 81 and the second interlayer-insulating film 96, a third interlayer-insulating film 99 is further formed, which in turn has the contact hole 98 formed thereon and intercommunicating with the high-density drain region 92e. The pixel electrode 76 is electrically connected to the high-density drain region 92e via this contact hole 98.

To the liquid crystal light valves 66r, 66g, and 66b structured as mentioned above, as shown in FIG. 9, the R-color light, the G-color light, and the B-color light are supplied, respectively. These colors are combined with the dichroic prism 67 after being modulated in the liquid crystal light valves so as to display color images using the integral additive mixture of color.

According to the liquid crystal light valves 66r, 66g, and 66b of the exemplary embodiment, as shown in FIG. 7, in the course of display using a plurality of the pixels 2, a pixel structure is configured in a delta arrangement, and the resolution at an oblique angle is thereby enhanced or improved with low-capacitance image data to have high-quality display, so that images such as natural paintings can be suitably displayed. On the other hand, in the course of display using a plurality of the second pixels A (see FIG. 1), a pixel structure is aligned in a square arrangement, such as a stripe and a mosaic, so that line drawings, such as characters and figures, other than the images can be displayed with clear contours.

The pixel structure according to the exemplary embodiment is not limited to the pixel structure shown in FIG. 7, i.e., the pixel structure shown in FIG. 1. Alternatively, arbitrary pixel structures within the scope of the present invention, such as structures shown FIGS. 2 to 4, can be incorporated, for example.

(Fifth Exemplary Embodiment of Electro-optical Apparatus and Second Exemplary Embodiment of Electronic Instrument)

Figure 13:
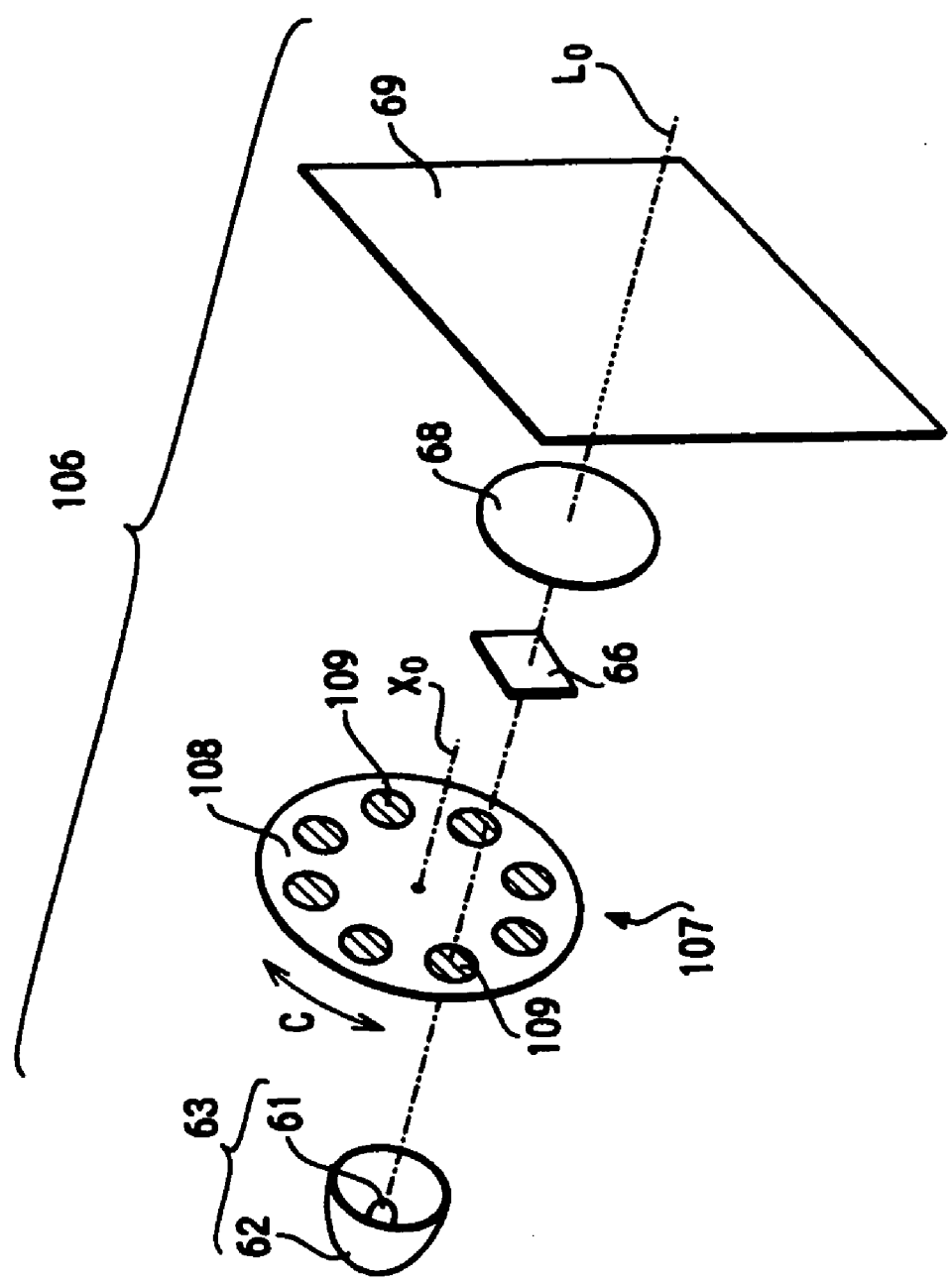
FIG. 13 is a drawing showing another example of the structure of a liquid crystal projector which is an exemplary embodiment of the electronic instrument according to the present invention.

FIG. 13 shows a liquid crystal projector which is an example of an electronic instrument and includes a liquid crystal device achieving an integral additive mixture of color. A liquid crystal projector 106 includes a light source 63 for emitting light, a filter device 107, a liquid crystal light valve 66, a projection lens 68, and a screen 69. The light source 63 is composed of a lamp 61 emitting white light and a reflector 62.

The filter device 107 includes a rotor 108 rotatable about an axial line X0 in a direction indicated by arrow C and a plurality (eight, according to the exemplary embodiment) of filter elements 109 arranged on a circumferential trajectory of the rotor 108. The rotor 108 is automatically rotated drivingly in association with image data using a drive source such as a motor. The plurality of filter elements 109 correspond to nine different colors including R, G, and B. For example, they include R, G, B, W, R', G', and B'. Where W denotes white; R' is not R but similar thereto; G' is not G but similar thereto; and B' is not B but similar thereto.

In the plurality of filter elements 109, in accordance with the rotation of the rotor 108, any desired element can be located on an optical path LO extending from the light source 63 toward the liquid crystal light valve 66. Thereby, a desired color can be supplied to the light valve. When the rotational speed of the rotor 108 is increased, a plurality of different colors can be displayed on human eyes in an overlapped state. Thereby, colors can be displayed by the integral additive mixture of color. According to the exemplary embodiment, the liquid crystal device is composed of the liquid crystal light valve 66 and a light-supplying system for supplying light with multiple-wavelength to the liquid crystal light valve 66. The light supplying system includes the light source 63 and the color filter device 107 according to the exemplary embodiment.

According to the exemplary embodiment, there are provided the pixel 2 and sub-pixels 3a to 3d shown in FIG. 1 within the liquid crystal light valve 66. Those kinds of colors such as W, B, R, G, or more can be established. Referring to FIG. 1, in the course of display using a plurality of the pixels 2, a pixel structure is configured in the delta arrangement, and the resolution at an oblique angle is thereby enhanced or improved with low-capacitance image data to have high-quality display, so that images such as natural paintings can be suitably displayed. On the other hand, in the course of display using a plurality of the second pixels A (see FIG. 1), a pixel structure is aligned in a square arrangement, such as a stripe arrangement and a mosaic arrangement, so that line drawings, such as characters and figures other than images, can be displayed with clear contours.

The pixel structure according to the exemplary embodiment is not limited to the pixel structure shown in FIG. 1. Alternatively, arbitrary pixel structures within the scope of the present invention, such as structures shown FIGS. 2 to 4, can be incorporated, for example.

(Sixth Exemplary Embodiment of Electro-optical Apparatus)

In the liquid crystal light valves 66r, 66g, and 66b, the pixel electrode 76 disposed within the element substrate 71a is made of a transparent material, and further the opposing electrode 79 disposed in the opposing substrate 71b is also made of a transparent material. Thus, the liquid crystal light valves 66r, 66g, and 66b are configured to be a transmission liquid crystal device. Whereas, if the pixel electrode 76 is made of a light-reflection conductive material, the liquid crystal light valves 66r, 66g, and 66b can be used for a reflection liquid crystal device that is observed from the opposing substrate 71b.

In this case, the data line 81 and the scanning line 82 are arranged on the backside of the pixel electrode 76 viewed in the observing direction. Since the pixel electrode 76 is opaque, the data line 81 and the scanning line 82 can be routed comparatively freely regardless of the position of the pixel electrode 76. In the example shown in FIG. 14, part 82a of the scanning line 82 intersects any of the sub-pixels 3a to 3d; however, the scanning line 82a does not adversely affect the display as long as the sub-pixel serves as an opaque reflection layer.

Figure 15:
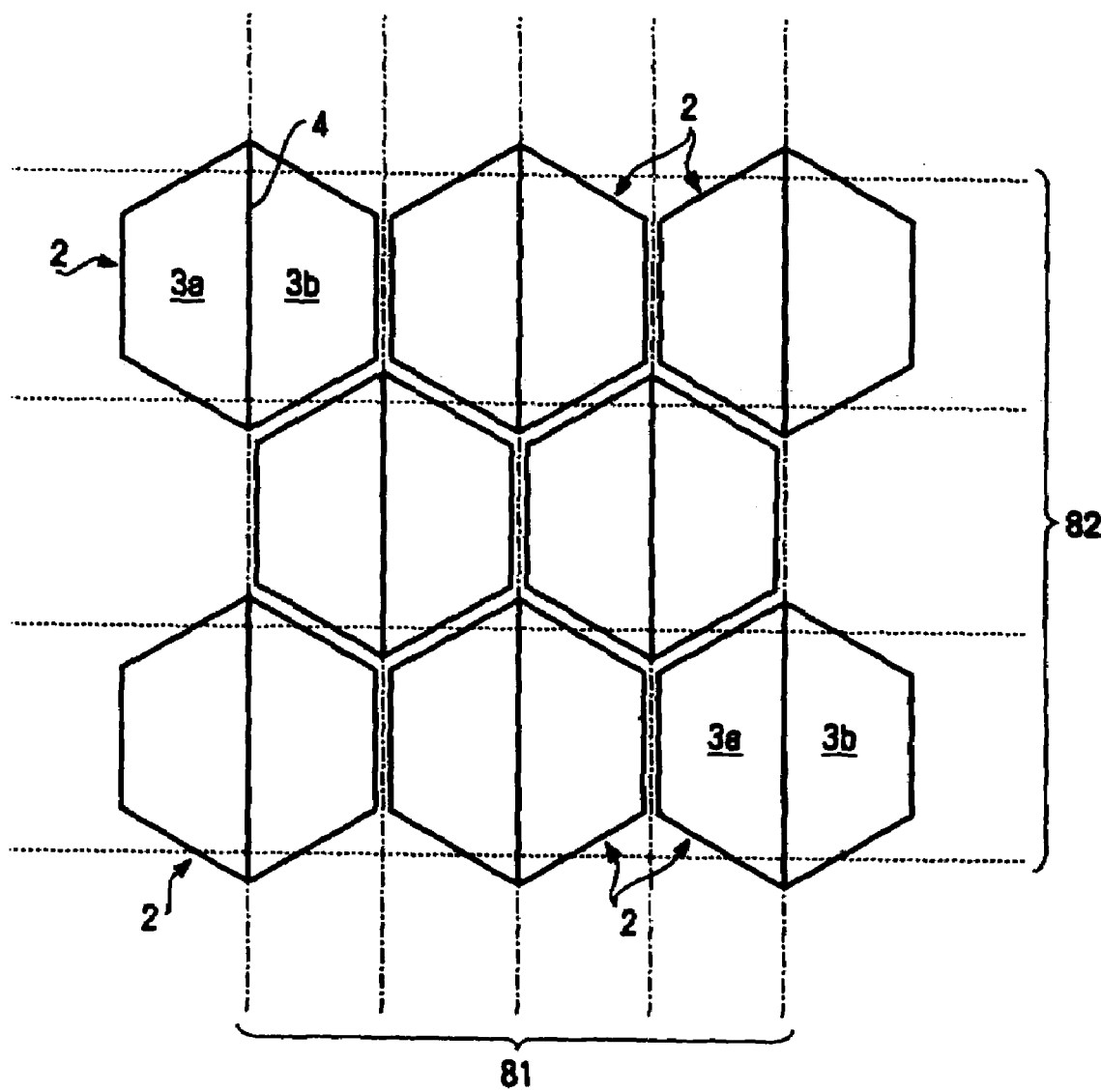
FIG. 15 is a plan view showing the relationship between pixels and wiring which are essential parts of still another exemplary embodiment of the electro-optical apparatus according to the present invention.

In the case where the pixel 2 is composed of two sub-pixels 2a and 3b, as shown in FIG. 15, the scanning line 82 may intersect the sub-pixels 3a and 3b; however, the scanning line 82a does not adversely affect the display even in this case.

In the above description, the reflection liquid crystal device is exemplified in an example in that the display is not adversely affected even when the scanning line 82 intersects the sub-pixel; alternatively, this is the same as in a top-emission EL device. The reason is that in the top-emission EL device, the scanning line and the data line do not disturb the display because it is structured by forming an electrode on the element substrate having the TFT element, the scanning line, and the data line formed thereon; forming the organic EL layer on the electrode; further forming a transparent electrode on the organic EL layer.

(Seventh Exemplary Embodiment of Electro-optical Apparatus)

In the liquid crystal light valves 66r, 66g, and 66b shown in FIG. 12, the pixel electrode 76 disposed within the element substrate 71a is made of a transparent material, and further the opposing electrode 79 disposed in the opposing substrate 71b is also made of a transparent material. Hence, the liquid crystal light valves 66r, 66g, and 66b are configured to be a transmission liquid crystal device. In such a transmission liquid crystal device, when wiring such as the scanning line and the data line intersects the sub-pixels 3a to 3d shown in FIG. 1, the display may be adversely affected. In order to avoid this influence, it is preferable that the wiring be arranged along the divided sides 4 of the sub-pixels 3a to 3d or their peripheral borders so as not to intersect the sub-pixels 3a to 3d. For example, according to the exemplary embodiment shown in FIG. 16, the scanning lines 82a are arranged along the peripheral borders of the sub-pixels 3a to 3d.

Figure 16:
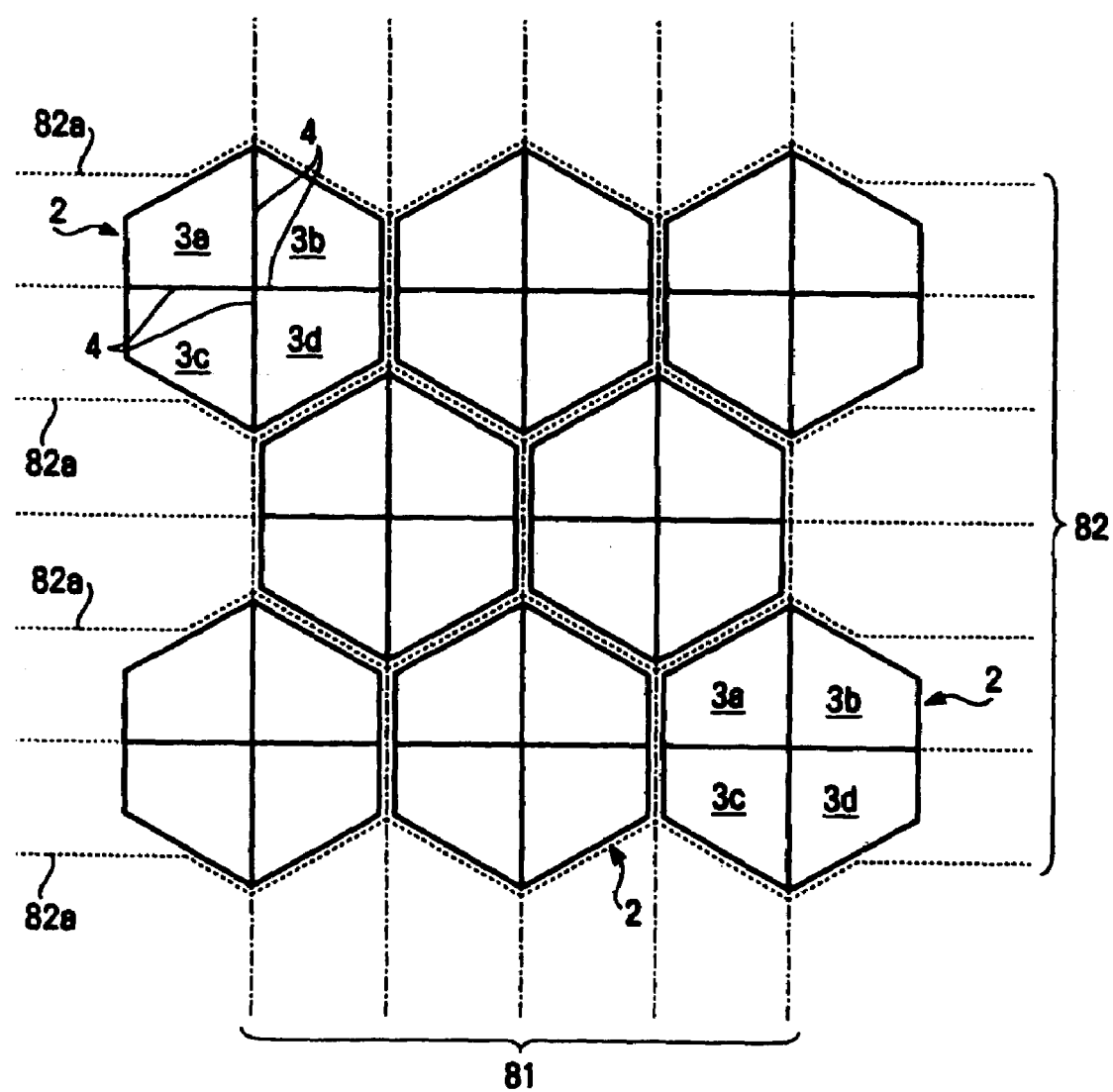
FIG. 16 is a plan view showing the relationship between pixels and wiring which are significant parts of still another exemplary embodiment of the electro-optical apparatus according to the present invention.

FIG. 16 shows an example of the pixel 2 divided into four sub-pixels 3a to 3d. As shown in FIG. 17, even when the pixel 2 is divided into two, it is preferable that the scanning line 82, the data line 81, and other wiring be arranged along the divided sides 4 of the sub-pixels 3a and 3b or their peripheral borders.

The configuration in that wiring such as the scanning line 82 is routed along the divided sides of the sub-pixels or their peripheral borders is not limited to the transmission liquid crystal device mentioned above; alternatively, it is also suitable for a bottom emission organic EL device. The reason is that in the bottom-emission organic EL device, the scanning line, the data line, and other wiring disturb the display because it is structured by forming a transparent electrode on the element substrate having the TFT element, the scanning line, and the data line formed thereon; forming an organic EL layer on the transparent electrode; further forming an opaque electrode on the organic EL layer so that the device is observed from the element substrate.

(Eighth Exemplary Embodiment of Electro-optical Apparatus)

According to the exemplary embodiments shown in FIGS. 16 and 17, wiring such as the scanning line 82 is routed in a zigzag arrangement, so that in view of wiring resistance and breaking, this is not preferable. In order to solve this problem, as shown in FIG. 18, it is preferable that two pieces of wiring such as the scanning lines 82 be linearly arranged together along the divided sides 4 of the sub-pixels 3a to 3d. In this case, intervals of the scanning lines 82 are not equal but unequal; however, there are no problems in the display.

(Other Exemplary Embodiments)

The present invention has been described with reference to preferred exemplary embodiments; however, the present invention is not limited to these exemplary embodiments and various modifications can be made in the scope of the invention described in accompanying claims.

In the above description, the reflection liquid crystal device and the organic EL device are exemplified in the electro-optical apparatus; alternatively, other arbitrary electro-optical apparatuses such as a PDP (plasma display), an FED (field emission display), and an SED (surface-conduction electron-emitter display) may also incorporate the present invention.

EXEMPLARY INDUSTRIAL APPLICABILITY

The pixel structure according to exemplary embodiments of the present invention is suitably used in an electro-optical apparatus, such as a liquid crystal device and an organic EL device, when images and line drawings are displayed. The electro-optical apparatus according to the present invention is used in a light valve of the liquid crystal projector as an electronic instrument; and a display for displaying various images in the electronic instrument, such as a mobile phone and a hand-held information terminal. The electronic instrument according to the present invention is utilized in the liquid crystal projector, the mobile phone, and the hand-held information terminal, for example.

What is claimed is:

1. An electro-optical apparatus, comprising:
a plurality of pixels disposed in a delta arrangement, each of the plurality of pixels including four sub-pixels that are four divisions divided from the pixel, divided sides of the sub-pixels being arranged in a vertical direction or in a horizontal direction, at least three of the four sub-pixels of each pixel each corresponding to a different one of the three colors of red, green and blue.

2. The electro-optical apparatus according to claim 1, wherein the sub-pixel other than the at least three sub-pixels of each pixel corresponds to the color green, so that the four sub-pixels of each pixel correspond to the colors of red, green, green and blue, respectively.

3. The electro-optical apparatus according to claim 1, wherein the sub-pixel other than the at least three sub-pixels of each pixel corresponds to the color white, so that the four sub-pixels of each pixel correspond to the colors of red, green, white and blue, respectively.

4. The electro-optical apparatus according to claim 1, further comprising a controller that selectively achieves a delta arrangement and a square arrangement by switching a manner of selecting the plurality of sub-pixels.

5. The electro-optical apparatus according to claim 4, the controller controls color display by a spatial additive mixture of color.

6. The electro-optical apparatus according to claim 1, wherein multiple-gradated images being displayed by area coverage gradation using the sub-pixels.

7. The electro-optical apparatus according to claim 1, further comprising:
   pixel electrodes each being analogous with the sub-pixel in shape, the sub-pixels including the pixel electrode; and
   wiring formed on a backside of the pixel electrodes viewed in an observation direction, the wiring including straight wiring passing through the sub-pixels viewed in the observation direction.

8. The electro-optical apparatus according to claim 7, further comprising a transparent electrode, a liquid crystal layer, a wiring layer; and a light-reflection layer which are arranged in that order in the observation direction.

* * * * *